(12) United States Patent
Sasajima et al.

(10) Patent No.: US 9,096,928 B2
(45) Date of Patent: Aug. 4, 2015

(54) METHOD OF MANUFACTURING SEMICONDUCTOR DEVICE AND SUBSTRATE PROCESSING APPARATUS

(75) Inventors: Ryota Sasajima, Toyama (JP); Yoshiro Hirose, Toyama (JP); Naonori Akae, Toyama (JP); Osamu Kasahara, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 666 days.

(21) Appl. No.: 13/227,312

(22) Filed: Sep. 7, 2011

(65) Prior Publication Data

US 2012/0064733 A1   Mar. 15, 2012

(30) Foreign Application Priority Data

Sep. 10, 2010   (JP) ................. 2010-203720

(51) Int. Cl.
*H01L 21/00*   (2006.01)
*C23C 16/34*   (2006.01)
*C23C 16/40*   (2006.01)
*C23C 16/455*   (2006.01)
*C23C 16/56*   (2006.01)

(52) U.S. Cl.
CPC ............. *C23C 16/345* (2013.01); *C23C 16/401* (2013.01); *C23C 16/45527* (2013.01); *C23C 16/56* (2013.01)

(58) Field of Classification Search
CPC   C23C 16/45; C23C 16/401; C23C 16/45527; C23C 16/56
See application file for complete search history.

(56) References Cited

U.S. PATENT DOCUMENTS

| | | | |
|---|---|---|---|
| 5,490,477 A * | 2/1996 | Knauth et al. | 117/43 |
| 7,557,424 B2 * | 7/2009 | Wong et al. | 257/529 |
| 2003/0029570 A1 * | 2/2003 | Kawamura et al. | 156/345.51 |
| 2003/0215963 A1 * | 11/2003 | AmRhein et al. | 438/9 |
| 2007/0096200 A1 * | 5/2007 | Lee et al. | 257/316 |
| 2008/0237190 A1 | 10/2008 | Aoki et al. | |
| 2009/0104740 A1 | 4/2009 | Inokuchi et al. | |
| 2009/0149032 A1 | 6/2009 | Kameda et al. | |
| 2009/0170328 A1 | 7/2009 | Kameda et al. | |
| 2009/0233454 A1 | 9/2009 | Okada | |
| 2010/0105192 A1 | 4/2010 | Akae et al. | |
| 2010/0128242 A1 * | 5/2010 | Lipson et al. | 355/72 |

FOREIGN PATENT DOCUMENTS

| | | |
|---|---|---|
| JP | 10242254 A | 9/1998 |
| JP | 2002076099 A | 3/2002 |
| JP | 2003-051533 A | 2/2003 |
| JP | 2003257960 A | 9/2003 |

(Continued)

*Primary Examiner* — Richard Booth
(74) *Attorney, Agent, or Firm* — Volpe and Koenig, P.C.

(57) ABSTRACT

Provided is a method of manufacturing a semiconductor device, including: forming a silicon oxide film on a surface of a substrate holder by repeatedly performing forming a silicon-containing layer on the surface of the substrate holder and oxidizing the silicon-containing layer; forming a thin film on a substrate by using a process gas; removing deposits attached onto the substrate holder by using a fluorine-containing gas; and reforming a silicon oxide film on the surface of the substrate holder after removal of the deposits by repeatedly performing forming a silicon-containing layer on the surface of the substrate holder and oxidizing the silicon-containing layer by using an oxygen-containing gas and a hydrogen-containing gas.

14 Claims, 12 Drawing Sheets

(56) References Cited

FOREIGN PATENT DOCUMENTS

| JP | 200885028 A | 4/2008 |
| JP | 2009032774 A | 2/2009 |
| JP | 2009-246340 A | 10/2009 |
| TW | 200746297 A | 12/2007 |
| TW | 200933730 A | 8/2009 |
| TW | 201030847 A | 8/2010 |

* cited by examiner

FIG. 5

| | Si | C | CVD-SiC | AlN |
|---|---|---|---|---|
| THERMAL CONDUCTIVITY (W/mk) | 148 | 129 | 140 | 90-200 |
| CONCENTRATION OF IMPURITY | ppb | % (SEVERAL %) | ppm | sub-% (BELOW 1%) |

FIG. 8

| 1 | Si D.E.R. | 9866 [Å/min] |
|---|---|---|
| 2 | SiN D.E.R. | 148 [Å/min] |
| 3 | SiC D.E.R. | 67 [Å/min] |
| 4 | Quartz D.E.R. | 8 [Å/min] |

FIG. 9

| 1 | Quartz D.E.R. | 440 [Å/min] |
|---|---|---|
| 2 | Thermal-SiO D.E.R. | 786 [Å/min] |
| 3 | CVD-SiO D.E.R. | 1248 [Å/min] |
| 4 | New-SiO(1) D.E.R. | 1100 [Å/min] |
| 5 | New-SiO(2) D.E.R. | 1062 [Å/min] |
| 6 | SiN D.E.R. | 2764 [Å/min] |

US 9,096,928 B2

METHOD OF MANUFACTURING SEMICONDUCTOR DEVICE AND SUBSTRATE PROCESSING APPARATUS

CROSS-REFERENCE TO RELATED APPLICATION

This application is based upon and claims the benefit of priority from Japanese Patent Application No. 2010-203720, filed on Sep. 10, 2010, the entire contents of which are incorporated herein by reference.

TECHNICAL FIELD

The present disclosure relates to a method of manufacturing a semiconductor device and a substrate processing apparatus.

BACKGROUND

A substrate processing apparatus is configured to form thin films on a substrate through a chemical vapor deposition (CVD) process or an atomic layer deposition (ALD) process. The thin films formed on a substrate may include a silicon nitride film (e.g., $Si_3N_4$ film; hereinafter, in some cases referred to as a SiN film), a polycrystalline silicon film (hereinafter, in some cases referred to as a poly-Si film) and the like. Such a substrate processing apparatus is provided with a process vessel configured to contain a substrate to be processed therein, a support member for supporting the substrate inside the process vessel, and a process gas supply system for supplying a process gas into the process vessel. In the substrate processing apparatus, the substrate placed on the support member is heated to a certain temperature. If the temperature of the substrate reaches a stable state after a lapse of a predetermined period of heating time, the process gas is supplied into the process vessel so that a thin film is formed on the substrate.

If the thin film formation process is repeatedly performed, it may cause a deposited film made of SiN, poly-Si or the like to be formed on an inner wall of the process vessel or a surface of the support member. As the deposited film becomes thicker, foreign materials may be generated by peeling-off of the deposited film and may adhere on a surface of the substrate. For this reason, once a cumulative thickness of the deposited film reaches a predetermined level, a cleaning process is performed in which a cleaning gas such as $ClF_3$, $NF_3$, HF, $F_2$, or the like is supplied into the process vessel to remove the deposited film by etching.

The support member may be formed of quartz ($SiO_2$), silicon carbide (SiC), aluminum nitride (AlN), or other ceramic materials. The support member may be made of a high heat conductivity material in order to stabilize the temperature of the substrate (in a short period of time). Also, the support member may be made of a material containing a small concentration of impurities in order to prevent contaminations inside the process vessel or on the surface of the substrate.

FIG. 5 is a table showing a relationship between a heat conductivity (thermal conductivity) and a level (or concentration) of impurities contained in various kinds of materials which may be employed in manufacturing the support member. As shown in FIG. 5, the MN material has a high heat conductivity of 90 to 200 W/mK, while a concentration of impurities thereof is also high in the order of sub-% level (e.g., below 1%). As such, the MN material may not be suitable as a material of the support member in terms of preventing contaminations inside the process vessel or on the surface of the substrate. On the other hand, SiC (hereinafter, in some cases referred to as CVD-SiC), which is formed by a CVD process, has a high heat conductivity of 140 W/mK, and a concentration of impurities thereof is low in the order of ppm units. Therefore, the SiC material has a property suitable to be used as a material of the support member.

In spite of such a suitable property as described above, the SiC material has poor workability due to its high stiffness. A technique for addressing such a problem may be effectively employed in which a carbon base material or a Si-impregnated SiC base material is shape-processed in advance and then, a SiC film having a thickness of, e.g., 10 to 200 micrometer (μm) is coated by a CVD process on a surface of the carbon base material or the Si-impregnated SiC base material so that the support member is implemented with the coated base material. FIG. 7 shows a schematic cross-sectional view of a support member with a CVD-SiC film coated on the surface of the carbon base material or the Si-impregnated SiC base material. In terms of the concentration of impurities, although the carbon base material or the Si-impregnated SiC base material is not comparable to the CVD-SiC film, such a base material with the CVD-SiC film coated thereon may be used in preventing the inside of the process vessel or the surface of the substrate from being contaminated. In some cases, impurities generated by machining which is performed during the shape-process may remain left on the surface of the carbon base material or the Si-impregnated SiC base material. In such a case, since the CVD-SiC film is coated on the surface of the base material, the contamination can be restrained as described above.

However, if the aforementioned cleaning process is performed on the support member having the above-described configuration, contamination may occur inside the processing chamber or on the substrate. In other words, the CVD-SiC film is etched by cleaning gas so that the carbon base material or the Si-impregnated SiC base material, each underlying the CVD-SiC film, is exposed, which may cause contaminations inside the processing chamber or on the surface of the substrate.

SUMMARY

The present disclosure provides some embodiments of an apparatus which prevents a SiC film formed on a carbon base material or an Si-impregnated SiC base material from being etched, thereby avoiding contamination of the inside of the processing chamber or the surface of a substrate, and a method for use in such an apparatus.

According to one embodiment of the present disclosure, provided is a method of manufacturing a semiconductor device, including: forming, in a state that a process vessel houses a substrate holder formed by coating a SiC film on a surface of a carbon base material or a Si-impregnated SiC base material through a CVD process, a silicon oxide film on the surface of the substrate holder by repeatedly performing supplying and exhausting a silicon-containing gas into and from the process vessel, to thereby form a silicon-containing layer on the surface of the substrate holder; and supplying and exhausting an oxygen-containing gas and a hydrogen-containing gas into and from the process vessel under an atmosphere having pressure below atmospheric pressure, to thereby change the silicon-containing layer into a silicon oxide layer; supplying and exhausting, in a state that a substrate is held by the substrate holder whose surface has the silicon oxide film formed thereon in the process vessel, a process gas into and from the process vessel, to thereby form a thin film other than the silicon oxide film on the substrate; supplying and exhausting, in a state that the substrate holder after repeatedly performing the thin film formation is housed in the process vessel, a fluorine-containing gas into and from the process vessel, to thereby remove deposits including the thin film attached onto the substrate holder; and reforming, in a state that the substrate holder after removal of the deposits is housed in the process vessel, a silicon oxide film on the surface of the substrate holder after removal of the deposits by repeatedly performing supplying and exhausting the silicon-containing gas into and from the process vessel, to thereby form a silicon-containing layer on the surface of the substrate holder after removal of the deposits, and supplying and exhausting the oxygen-containing gas and the hydrogen-containing gas into and from the process vessel under an atmosphere having pressure below atmospheric pressure, to thereby change the silicon-containing layer into a silicon oxide layer.

According to another embodiment of the present disclosure, provided is a substrate processing apparatus, including: a process vessel configured to house a substrate therein for processing; a substrate holder configured to support the substrate in the process vessel, the substrate holder being formed by coating a SiC film on a surface of a carbon base material or a Si-impregnated SiC base material through a CVD process; a process gas supply system configured to supply a process gas into the process vessel; a silicon-containing gas supply system configured to supply a silicon-containing gas into the process vessel; an oxygen-containing gas supply system configured to supply an oxygen-containing gas into the process vessel; a hydrogen-containing gas supply system configured to supply a hydrogen-containing gas into the process vessel; a fluorine-containing gas supply system configured to supply a fluorine-containing gas into the process vessel; an exhaust system configured to exhaust an inside of the process vessel; and a controller configured to control the operations of the process gas supply system, the silicon-containing gas supply system, the oxygen-containing gas supply system, the hydrogen-containing gas supply system, the fluorine-containing gas supply system, and the exhaust system, so as to perform forming, in a state that the process vessel houses the substrate holder, a silicon oxide film on the surface of the substrate holder by repeatedly performing supplying and exhausting the silicon-containing gas into and from the process vessel, to thereby form a silicon-containing layer on the surface of the substrate holder, and supplying and exhausting the oxygen-containing gas and the hydrogen-containing gas into and from the process vessel under an atmosphere having pressure below atmospheric pressure, to thereby change the silicon-containing layer into a silicon oxide layer; supplying and exhausting, in a state that the substrate is held by the substrate holder whose surface has the silicon oxide film formed thereon in the process vessel, the process gas into and from the process vessel, to thereby form a thin film other than the silicon oxide film on the substrate; supplying and exhausting, in a state that the substrate holder after repeatedly performing the thin film formation is housed in the process vessel, a fluorine-containing gas into and from the process vessel, to thereby remove deposits including the thin film attached onto the substrate holder; reforming, in a state that the substrate holder after removal of the deposits is housed in the process vessel, a silicon oxide film on the surface of the substrate holder after removal of the deposits by repeatedly performing supplying and exhausting the silicon-containing gas into and from the process vessel, to thereby form a silicon-containing layer on the surface of the substrate holder after removal of the deposits, and supplying and exhausting the oxygen-containing gas and the hydrogen-containing gas into and from the process vessel under an atmosphere having pressure below atmospheric pressure, to thereby change the silicon-containing layer into a silicon oxide layer.

BRIEF DESCRIPTION OF THE DRAWINGS

FIG. 5 is a table showing a relationship between a heat conductivity and a concentration of impurities contained in various kinds of materials which may be employed in producing the support member.

FIG. 8 is a table showing examples of dry etching rates for various kinds of materials.

FIG. 9 is a table showing examples of dry etching rates for quartz, various kinds of oxide films and SiN.

DETAILED DESCRIPTION

One Embodiment (1) Configuration of Substrate Processing Apparatus

Figure 3:
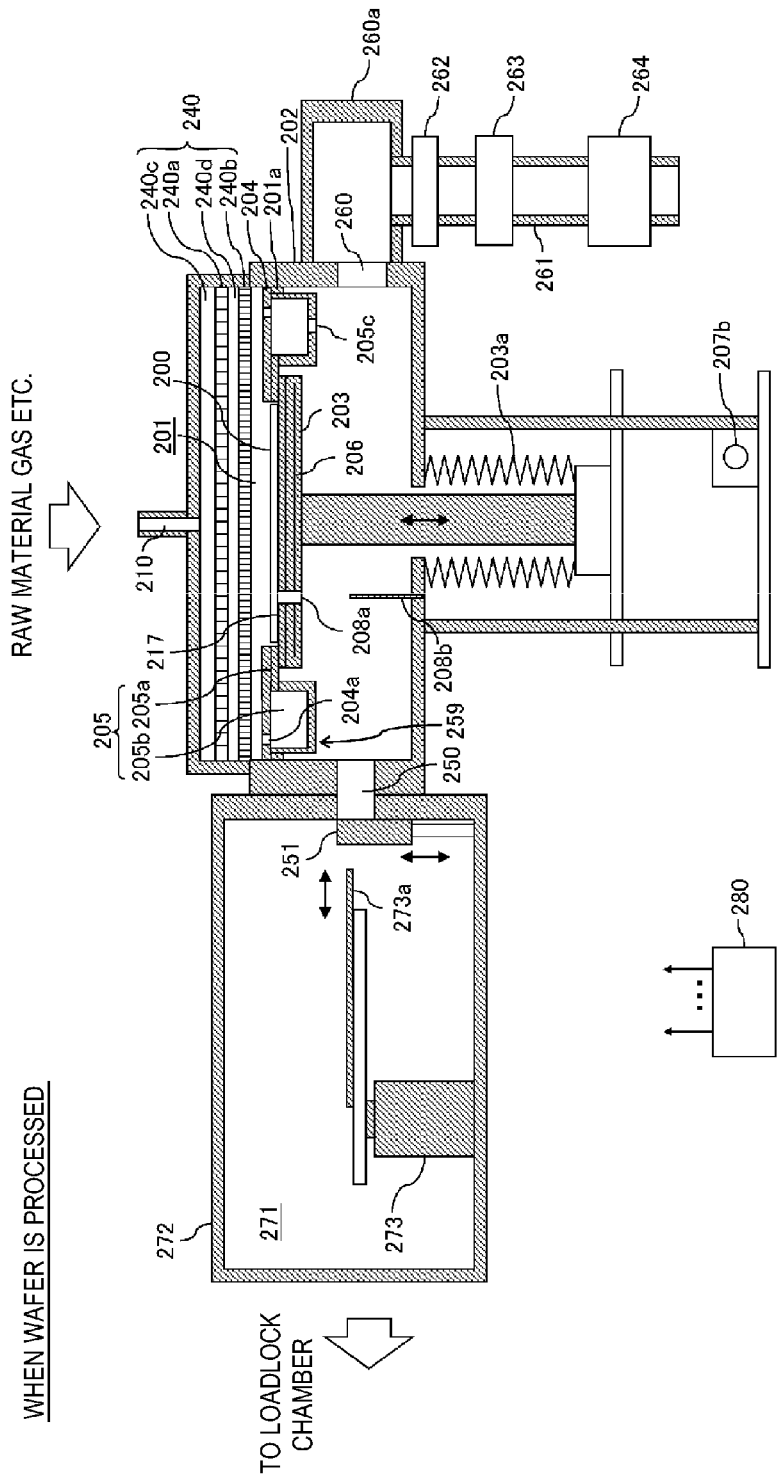
FIG. 3 is a sectional elevational view showing a wafer process which is performed in the substrate processing apparatus in accordance with one embodiment of the present disclosure.
Figure 4:
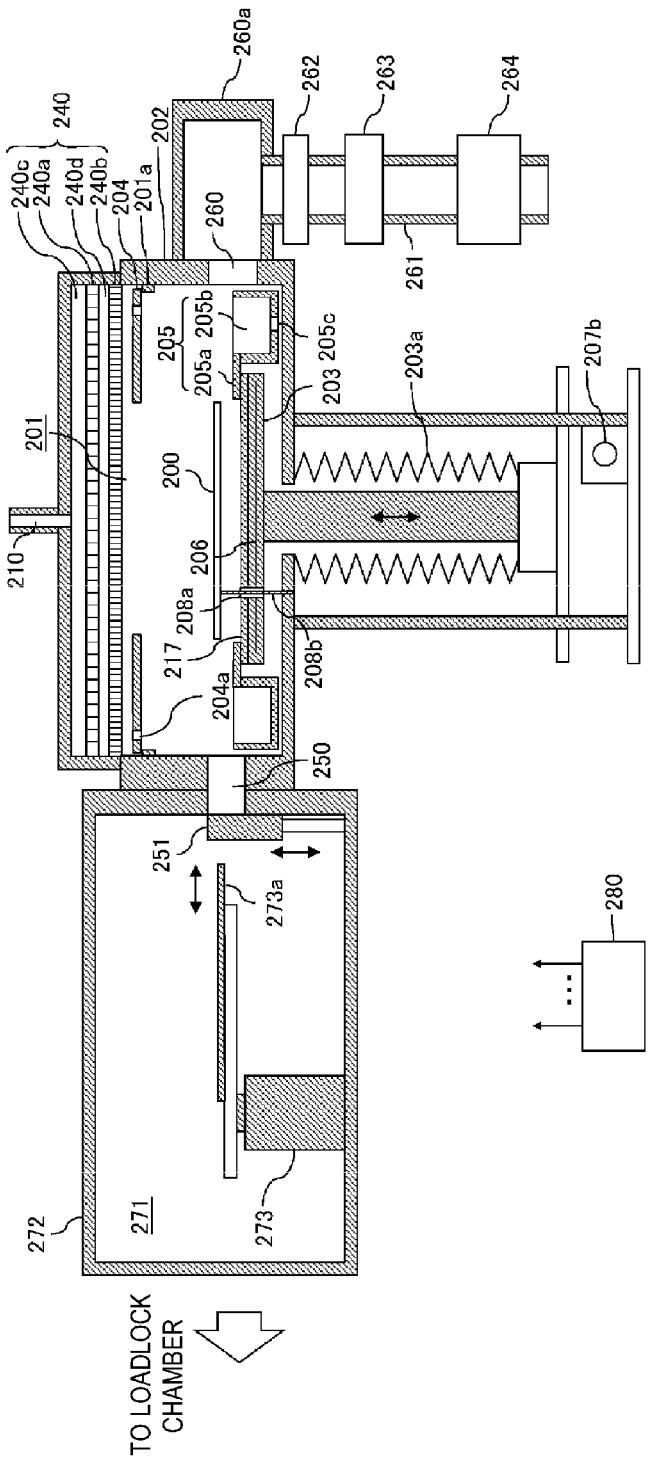
FIG. 4 is a sectional elevational view showing a wafer carrying process which is performed in the substrate processing apparatus in accordance with one embodiment of the present disclosure.

In the following, a configuration of a substrate processing apparatus in accordance with one embodiment of the present disclosure will be described with reference to FIGS. 3 and 4. FIG. 3 is a sectional elevational view showing a wafer process which is performed in the substrate processing apparatus in accordance with one embodiment of the present disclosure. FIG. 4 is a sectional elevational view showing a wafer carrying process which is performed in the substrate processing apparatus in accordance with one embodiment of the present disclosure.

<Processing Chamber>

As shown in FIGS. 3 and 4, the substrate processing apparatus according to the present embodiment is provided with a process vessel 202. The process vessel 202 may be configured as an airtight vessel having a transverse-section plane of, e.g., a flat circular shape. Also, the process vessel 202 may be made of a metallic material such as aluminum (Al), stainless steel (of e.g., type SUS), or the like. Inside the process vessel 202, a processing chamber 201 is provided to process a wafer 200 such as a silicon wafer (used as a substrate).

<Support Stage>

Figure 6:
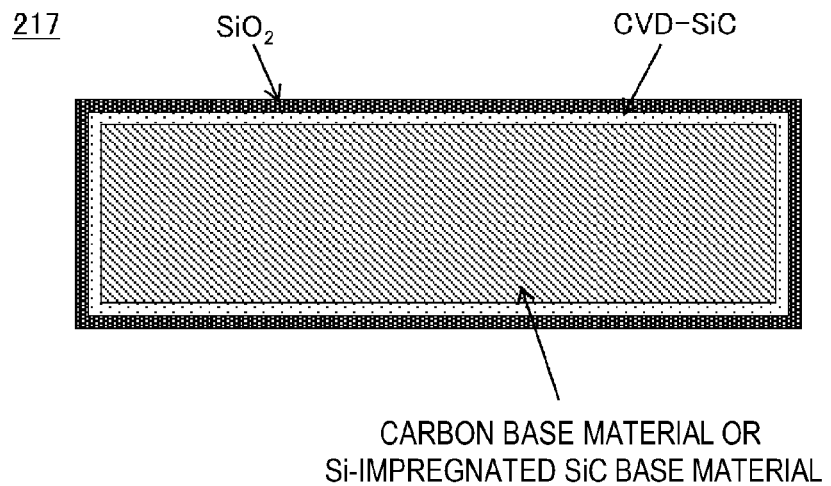
FIG. 6 shows a schematic cross-sectional view of a susceptor in accordance with one embodiment of the present disclosure.
Figure 7:
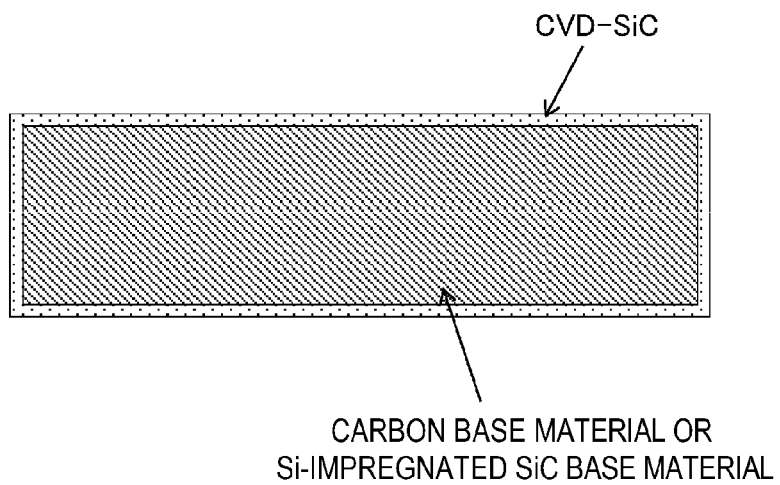
FIG. 7 shows a schematic cross-sectional view of a support member with a CVD-SiC film coated on a surface of a carbon base material or a Si-impregnated SiC base material.

A support stage 203 configured to support the wafer 200 placed thereon is provided inside the processing chamber 201. On the top surface of the support stage 203 being in contact directly with the wafer 200, a susceptor 217 (used as a support member) configured to support the wafer 200 to be processed is disposed. FIG. 6 shows a schematic cross-sectional view of the susceptor 217 in accordance with one embodiment of the present disclosure. The susceptor 217 is formed by coating a SiC film on a surface of a carbon base material or a Si-impregnated SiC base material which has been subjected to a shape-process, through a chemical vapor deposition (CVD), followed by forming a silicon oxide film ($SiO_2$ film; hereinafter in some cases referred to as a SiO film) on the outermost surface of the SiC film. The SiO film is formed by repeatedly performing processes of forming a silicon-containing layer on the CVD-SiC film by using a silicon-containing gas and oxidizing the silicon-containing layer by using an oxygen-containing gas and a hydrogen-containing gas under an atmosphere having pressure, for example, below atmospheric pressure. The formation of the SiO film on the outermost surface of the CVD-SiC film will be described later in detail. A heater 206 used as a heating part (i.e., heating source) configured to heat the wafer 200 is provided in the support stage 203. Also, a lower end portion of the support stage 203 is designed to penetrate a portion of the bottom of the process vessel 202.

<Elevation Mechanism>

An elevation mechanism 207b configured to vertically move the support stage 203 is disposed outside the processing chamber 201. The support stage 203 is vertically moved by means of the elevation mechanism 207b so that the wafer 200 supported on the susceptor 217 can be vertically elevated. By means of the elevation mechanism 207b, the support stage 203 is lowered up to a position (i.e., wafer transferring position) as shown in FIG. 4 when the wafer 200 is transferred. On the other hand, the support stage 203 is lifted up to a position (i.e., wafer process position) as shown in FIG. 3 when the wafer 200 is processed. Also, the lower end portion of the support stage 203 is surrounded with a bellows 203a so that the interior of the processing chamber 201 can be hermetically kept.

<Lift Pin>

On a lower surface (i.e., bottom surface) of the processing chamber 201, a plurality (e.g., three) of lift pins 208b is vertically provided. In the support stage 203 (including the susceptor 217), a plurality (e.g., three) of penetration holes 208a, through which the respective lift pins 208b are passed, is formed at positions corresponding to the lift pins 208b. With this arrangement, when the support stage 203 is lowered to the wafer transferring position, as shown in FIG. 4, upper ends of the lift pins 208b protrude from the top surface of the susceptor 217, so that the lift pins 208b support the wafer 200 from the bottom side thereof. On the other hand, when the support stage 203 is lifted up to the wafer process position, as shown in FIG. 3, the lift pins 208b are retracted from the top surface of the susceptor 217, so that the susceptor 217 support the wafer 200 from the bottom side thereof. As described above, since the lift pins 208b are in contact directly with the substrate (i.e., wafer) 200, the lift pins 208b may be made of a material such as quartz, alumina, or the like.

<Wafer Transferring Gate>

A wafer transferring gate 250 to transfer the wafer 200 in and out of the processing chamber 201 is formed on one surface of an internal wall of the processing chamber 201 (or the process vessel 202). A gate valve 251 is disposed at the wafer transferring gate 250. The gate valve 251 is opened so that the processing chamber 201 and a transferring chamber (preliminary chamber) 271 are in communication with each other. The transferring chamber 271 is formed inside a transferring vessel (airtight vessel) 272. A transferring robot 273 configured to transfer the wafer 200 is disposed in the transferring chamber 271. The transferring robot 273 is equipped with a transferring arm 273a configured to support the wafer 200 when the wafer 200 is transferred. When the support stage 203 is lowered to the wafer transferring position, the gate valve 251 is opened so that the wafer 200 can be transferred between the processing chamber 201 and the transferring chamber 271 by means of the transferring robot 273. The wafer 200 transferred into the processing chamber 201 is temporarily placed on the lift pins 208b as described above. In addition, a loadlock chamber (not shown) is provided at one side (facing the wafer transferring gate 250) of the transferring chamber 271. With this arrangement, the wafer 200 can be transferred between the loadlock chamber and the transferring chamber 271 by means of the transferring robot 273. The loadlock chamber serves as another preliminary chamber which temporarily holds a non-processed or processed wafer 200.

<Exhaust System>

On another surface (facing the wafer transferring gate 250) of the internal wall of the processing chamber 201 (or the process vessel 202), an exhaust outlet 260 configured to exhaust atmosphere inside the processing chamber 201 is provided. An exhaust pipe 261 is connected to the exhaust outlet 260 through an exhaust chamber 260a. An auto pressure controller (APC) valve 262 (used as a pressure regulator) configured to control the inside of the processing chamber 201 to a predetermined pressure, a raw material collection trap 263, and a vacuum pump 264 are sequentially connected to the exhaust pipe 261 in this order. An exhaust system (exhaust line) for exhausting an inside of the process vessel 202 is mainly configured with the exhaust outlet 260, the exhaust chamber 260a, the exhaust pipe 261, the APC valve 262, the raw material collection trap 263, and the vacuum pump 264.

<Gas Inlet>

A gas inlet 210 through which various kinds of gases are introduced into the processing chamber 201, is formed on the top surface (or top plate) of a shower head 240 (which will be described later) disposed on an upper portion of the processing chamber 201. A configuration of a gas supply system connected to the gas inlet 210 will be described later.

<Shower Head>

The shower head 240 (used as a gas distributing mechanism) is disposed between the gas inlet 210 and the processing chamber 201. The shower head 240 includes a distribution plate 240a configured to distribute gas introduced thereto through the gas inlet 210, and a shower plate 240b configured to further uniformly distribute and supply the surface of the wafer 200 placed on the support stage 203 with the gas that has passed through the distribution plate 240a. A plurality of ventilation holes are formed on the distribution plate 240a and the shower plate 240b. The distribution plate 240a is disposed between the top surface of the shower head 240 and the shower plate 240b. The shower plate 240b is disposed to face the wafer 200 placed on the support stage 203. Spaces are formed between the top surface of the shower head 240 and the distribution plate 240a and between the distribution plate 240a and the shower plate 240b, respectively. These spaces function as a first buffer space (or distribution chamber) 240c in which the gas introduced thereto through the gas inlet 210 is distributed, and a second buffer space 240d in which the distributed gas passing through the distribution plate 240a is diffused.

<Exhaust Duct>

A stepped portion 201a is formed on an internal wall surface of the processing chamber 201 (or the process vessel 202). The stepped portion 201a is configured to hold a conductance plate 204 at a position close to where the wafer is processed. The conductance plate 204 is configured as one sheet of a doughnut-shaped (or ring-shaped) circular plate having an opening to place the wafer 200 within its inner circumferential portion. On an outer circumferential portion of the conductance plate 204, a plurality of discharge outlets 204a are formed to be spaced apart by a predetermined distance in a circumferential direction of the conductance plate 204. The discharge outlets 204a are discontinuously formed such that the outer circumferential portion of the conductance plate 204 can support the inner circumferential portion thereof.

A lower plate 205 is engaged with the outer circumferential portion of the support stage 203. The lower plate 205 includes a ring-shaped concave portion 205b and a flange 205a integrally formed on an internal upper side of the concave portion 205b. The concave portion 205b is formed to occupy a space between the outer circumferential portion of the support stage 203 and the internal wall surface of the processing chamber 201. At a position adjacent to the exhaust outlet 260, a plate exhaust outlet 205c is formed on the lower side of the concave portion 205b to discharge (or ventilate) a gas from the inside of the concave portion 205b to the exhaust outlet 260. The flange 205a is configured to function as an engaging part that engages with the outer circumferential portion of the upper portion of the support stage 203. Such an engagement of the flange 205a with the outer circumferential portion of the upper portion of the support stage 203 enables the lower plate 205 to be lifted up together with the support stage 203 in conjunction with the elevation of the support stage 203.

When the support stage 203 is lifted up to the wafer process position, the lower plate 205 is also lifted up to the wafer process position. Then, the top surface of the concave portion 205b of the lower plate 205 is blocked by the conductance plate 204 held at a (vertical) position close to the wafer process position, so that the interior of the concave portion 205b defines a gas flow passage region as an exhaust duct 259. In this arrangement, by the exhaust duct 259 (including the conductance plate 204 and the lower plate 205) and the support stage 203, the interior of the processing chamber 201 is divided into an upper processing chamber positioned above the exhaust duct 259 and a lower processing chamber positioned below the exhaust duct 259. In one embodiment, the conductance plate 204 and the lower plate 205 may be made of a material, e.g., quartz having a high-temperature-resistance and high-load resistance, in order to prepare for cases of etching (or self-cleaning) byproducts deposited on the internal wall of the exhaust duct 259.

The following is a description of a gas flow inside the processing chamber 201 in the course of the wafer process. First, a gas supplied from the gas inlet 210 to the upper portion of the shower head 240 flows from the first buffer space (or the distribution chamber) 240c to the second buffer space 240d through the plurality of the ventilation holes formed on the distribution plate 240a. Then, the gas is supplied to the interior of the processing chamber 201 through a plurality of holes formed on the shower plate 240b so that it is uniformly supplied to the wafer 200. The gas supplied on the wafer 200 flows in a radial direction toward a radial outer side of the wafer 200. Gas which is surplus or has been in contact with the wafer 200 flows radially along on the exhaust duct 259 placed on the outer circumferential portion of the wafer 200 (i.e., on the conductance plate 204) toward the radial outside of the wafer 200, and then is introduced through the discharge outlet 204a formed on the conductance plate 204 into the gas flow passage region (i.e., the inside of the concave portion 205b) in the exhaust duct 259. Thereafter, the gas flows along the interior of the exhaust duct 259 so that it is exhausted through the exhaust outlet 260 via the plate exhaust outlet 205c. By doing so, it is possible to prevent the gas from flowing to the lower portion of the processing chamber 201, i.e., the rear side of the support stage 203 or the bottom side of the processing chamber 201.

<Gas Supply System>

Figure 2:
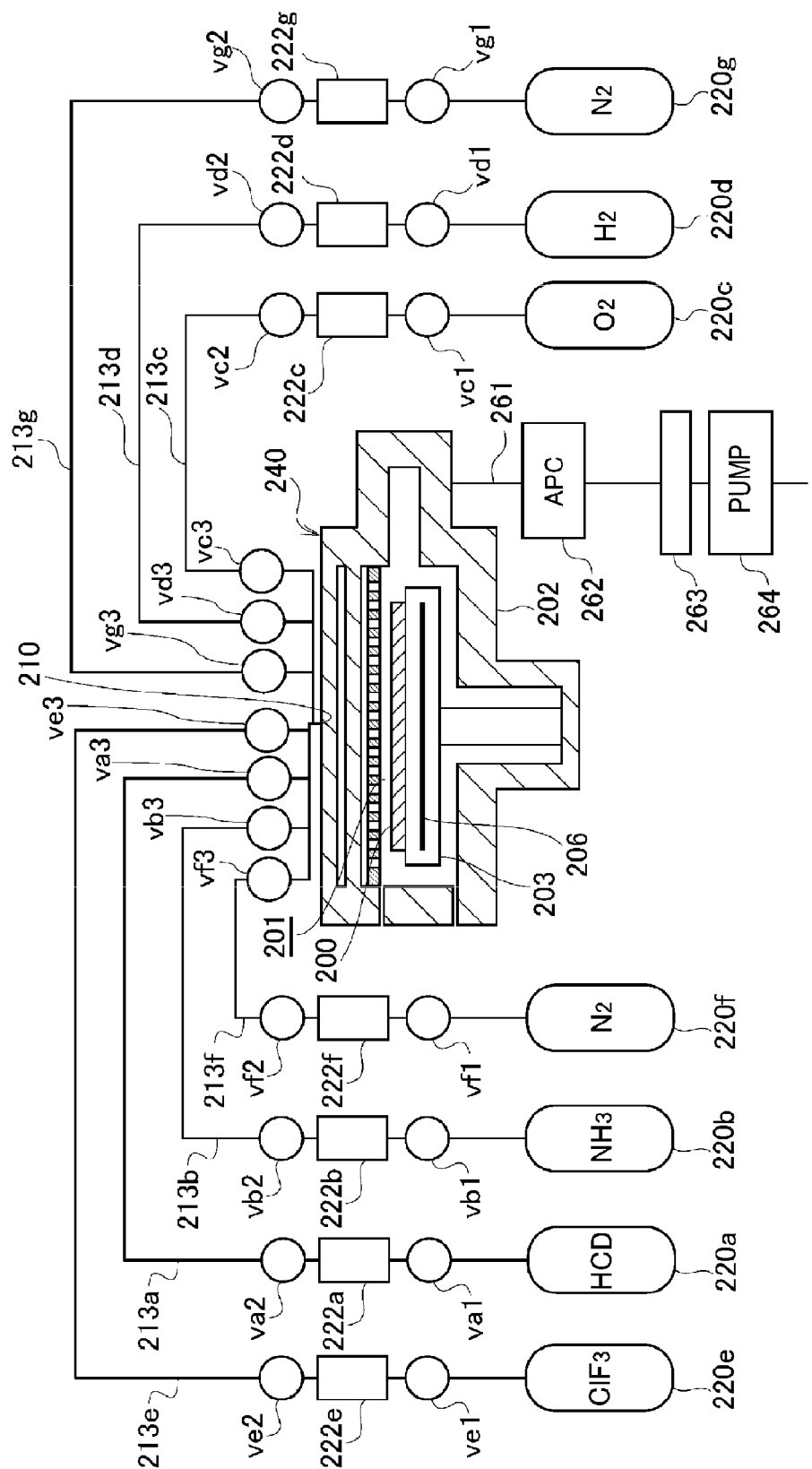
FIG. 2 is a diagram showing a configuration of a gas supply system provided in a substrate processing apparatus in accordance with one embodiment of the present disclosure.

With reference to FIG. 2, a configuration of the gas supply system connected to the gas inlet 210 will be described herein. FIG. 2 shows a configuration of the gas supply system (or gas supply lines) of the substrate processing apparatus in accordance with the present embodiment of the present disclosure.

As shown in FIG. 2, the gas supply system of the substrate processing apparatus according to the present embodiment includes a process gas supply system configured to supply a process gas into the inside of the processing chamber 201, a cleaning gas supply system configured to supply a cleaning gas into the inside of the processing chamber 201, an oxygen-containing gas supply system configured to supply an oxygen-containing gas into the inside of the processing chamber 201, a hydrogen-containing gas supply system configured to supply a hydrogen-containing gas into the inside of the processing chamber 201, and first and second inert gas supply systems configured to supply inert gases into the inside of the processing chamber 201. The process gas supply system further includes a raw material gas supply system configured to supply a silicon-containing gas (used as a raw material) into the inside of the processing chamber 201 and a reaction gas supply system configured to supply a reaction gas into the inside of the processing chamber 201. The following is a description of a configuration of each of the supply systems <Raw Material Gas Supply System>

Provided at the exterior of the processing chamber 201 is a raw material gas supply source 220a configured to supply the silicon-containing gas (used as the raw material gas) into the inside of the processing chamber 201. One end portion (positioning at an upstream side) of a raw material gas supply pipe 213a is connected to the raw material gas supply source 220a. The other end portion (positioning at a downstream side) of the raw material gas supply pipe 213a is connected to the gas inlet 210 through a valve va3. A mass flow controller (MFC) 222a (used as a flow rate controller) configured to control a supply flow rate of the raw material gas, and valves va1 and va2 configured to control the supply of the raw material gas are connected to the raw material gas supply pipe 213a. The raw material gas may include, e.g., a HCD ($Si_2Cl_6$) gas. The raw material gas supply system (or raw material gas supply lines) is mainly constituted by the raw material gas supply source 220a, the raw material gas supply pipe 213a, the MFC 222a, and valves va1, va2, and va3.

<Reaction Gas Supply System>

Provided at the outside of the processing chamber 201 is a reaction gas supply source 220b configured to supply the reaction gas into the inside of the processing chamber 201. One end portion (positioning at an upstream side) of a reaction gas supply pipe 213b is connected to the reaction gas supply source 220b. The other end portion (positioning at a downstream side) of the reaction gas supply pipe 213b is connected through a valve vb3 to a more downstream stage of the raw material gas supply pipe 213a from the valve va3. An MFC 222b (used as the flow rate controller) configured to control a supply flow rate of the reaction gas, and valves vb1 and vb2 configured to control the supply of the reaction gas are connected to the reaction gas supply pipe 213b. The reaction gas may include, e.g., ammonia gas ($NH_3$). The reaction gas supply system (or reaction gas supply lines) is mainly constituted by the reaction gas supply source 220b, the reaction gas supply pipe 213b, the MFC 222b, and the valves vb1, vb2, and vb3.

<Cleaning Gas Supply System>

Provided at the outside of the processing chamber 201 is a cleaning gas supply source 220e configured to supply the cleaning gas into the inside of the processing chamber 201. One end portion (positioning at an upstream side) of a cleaning gas supply pipe 213e is connected to the cleaning gas supply source 220e. The other end portion (positioning at a downstream side) of the cleaning gas supply pipe 213e is connected through a valve ve3 to a more downstream stage of the raw material gas supply pipe 213a from the valve va3. An MFC 222e (used as the flow rate controller) configured to control a supply flow rate of the cleaning gas, and valves ve1 and ve2 configured to control the supply of the cleaning gas are connected to the cleaning gas supply pipe 213e. The cleaning gas may include, e.g., fluorine-containing gas such as chlorine trifluoride ($ClF_3$) gas, or the like. The cleaning gas supply system (or cleaning gas supply lines) is mainly constituted by the cleaning gas supply source 220e, the cleaning gas supply pipe 213e, the MFC 222e, and the valves ve1, ve2, and ve3.

<Oxygen-Containing Gas Supply System>

Provided at the outside of the processing chamber 201 is an oxygen-containing gas supply source 220c configured to supply the oxygen-containing gas into the inside of the processing chamber 201. One end portion (positioning at an upstream side) of an oxygen-containing gas supply pipe 213c is connected to the oxygen-containing gas supply source 220c. The other end portion (positioning at a downstream side) of the oxygen-containing gas supply pipe 213c is connected to the gas inlet 210 through a valve vc3. An MFC 222c (used as the flow rate controller) configured to control a supply flow rate of the oxygen-containing gas, and valves vc1 and vc2 configured to control the supply of the oxygen-containing gas are connected to the oxygen-containing gas supply pipe 213c. The oxygen-containing gas may include, e.g., an oxygen ($O_2$) gas. The oxygen-containing gas supply system (or oxygen-containing gas supply lines) is mainly constituted by the oxygen-containing gas supply source 220c, the oxygen-containing gas supply pipe 213c, the MFC 222c, and the valves vc1, vc2, and vc3.

<Hydrogen-Containing Gas Supply System>

Provided at the outside of the processing chamber 201 is a hydrogen-containing gas supply source 220d configured to supply the hydrogen-containing gas into the inside of the processing chamber 201. One end portion (positioning at an upstream side) of a hydrogen-containing gas supply pipe 213d is connected to the hydrogen-containing gas supply source 220d. The other end portion (positioning at a downstream side) of the hydrogen-containing gas supply pipe 213d is connected through a valve vd3 to a more downstream stage of the oxygen-containing gas supply pipe 213c from the valve vc3. An MFC 222d (used as the flow rate controller) configured to control a supply flow rate of the hydrogen-containing gas, and valves vd1 and vd2 configured to control the supply of the hydrogen-containing gas are connected to the hydrogen-containing gas supply pipe 213d. The hydrogen-containing gas may include, e.g., hydrogen ($H_2$) gas. The hydrogen-containing gas supply system (or hydrogen-containing gas supply lines) is mainly constituted by the hydrogen-containing gas supply source 220d, the hydrogen-containing gas supply pipe 213d, the MFC 222d, and the valves vd1, vd2, and vd3.

<First and Second Inert Gas Supply Systems>

Provided at the outside of the processing chamber 201 are inert gas supply sources 220f and 220g, each being configured to supply an inert gas into the inside of the processing chamber 201. One end portion (positioning at an upstream side) of an inert gas supply pipe 213f is connected to the inert gas supply source 220f. The other end portion (positioning at a downstream side) of the inert gas supply pipe 213f is connected through a valve vf3 to a more downstream stage of the raw material gas supply pipe 213a from the valve va3. An MFC 222f (used as the flow controller) configured to control a supply flow rate of the inert gas, and valves vf1 and vf2 configured to control the supply of the inert gas are connected to the inert gas supply pipe 213f. Also, one end portion (positioning at an upstream side) of an inert gas supply pipe 213g is connected to the inert gas supply source 220g. The other end portion (positioning at a downstream side) of the inert gas supply pipe 213g is connected to through a valve vg3 to a more downstream stage of the oxygen-containing gas supply pipe 213c from the valve vc3. An MFC 222g (used as the flow rate controller) configured to control a supply flow rate of the inert gas, and valves vg1 and vg2 configured to control the supply of the inert gas are connected to the inert gas supply pipe 213g. The inert gas may include, e.g., a nitrogen ($N_2$) gas. The first inert gas supply system (or first inert gas supply lines) is mainly constituted by the inert gas supply source 220f, the inert gas supply pipe 213f, the MFC 222f, and the valves vf1, vf2, and vf3. The second inert gas supply system (or second inert gas supply lines) is mainly constituted by the inert gas supply source 220g, the inert gas supply pipe 213g, the MFC 222g, and the valves vg1, vg2, and vg3.

<Controller>

The substrate processing apparatus according to the present embodiment includes a controller 280 configured to control operations of respective components provided to the substrate processing apparatus. Specifically, the controller 280 controls operations of the gate valve 251, the elevation mechanism 207b, the transferring robot 273, the heater 206, a sub-heater (not shown), the APC valve 262, the vacuum pump 264, the valves va1 to va3, vb1 to vb3, vc1 to vc3, vd1 to vd3, ve1 to ve3, vf1 to vf3, and vg1 to vg3, and the MFCs 222a, 222b, 222c, 222d, 222e, 222f, and 222g.

(2) Substrate Processing Process

With reference to FIG. 1, a substrate processing process according to one embodiment of the present disclosure will now be described herein. The substrate processing process according to the present embodiment includes a SiO film forming step S1 for forming a SiO film on a CVD-SiC film formed on a surface of the susceptor 217, a modification step S2 for modifying the SiO film by using $O_2$ gas and $H_2$ gas under an atmosphere having pressure below atmospheric pressure, a pre-coating step S3 for covering (or pre-coating) the internal wall of the processing chamber 201 with a SiN film, a thin film forming step S4 for forming the SiN film on the wafer 200, a cleaning step S5 for removing deposits attached on the internal wall of the processing chamber 201, and a reforming step S6 for reforming the SiO film on the surface of susceptor 217 after the removal of the deposits. As described above, the operations of the respective components provided to the substrate processing apparatus are controlled by the controller 280.

<SiO Film Forming Step S1>

In the SiO film forming step S1, the SiO film is formed on the CVD-SiC film, which is coated on the surface of a carbon base material, or a Si-impregnated SiC base material, by repetitively performing steps of forming a silicon-containing layer on the SiC film using an HCD (raw material) gas and oxidizing the silicon-containing layer using $O_2$ gas and $H_2$ gas under an atmosphere having pressure below atmospheric pressure. The SiO film forming step S1 will be described in detail as below.

[Gate Valve Closing Step S1a]

In a state where the wafer 200 is not loaded into the processing chamber 201, i.e., the wafer 200 is not placed on the support stage 203 to expose the top surface of the susceptor 217, the gate valve 251 is closed. In this situation, by operating the elevation mechanism 207b, the susceptor 217 is lifted up to the wafer process position as shown in FIG. 3. In addition, the CVD-SiC film is coated on the surface of the carbon base material or the Si-impregnated SiC base material that implements the susceptor 217 beforehand.

[Pressure Regulating & Temperature Controlling Step S1b]

Subsequently, the interior of the processing chamber 201 is vacuum-exhausted by means of the vacuum pump 264 so that a pressure therein is maintained at a predetermined pressure (or a vacuum degree). The pressure within the processing chamber 201 is measured by a pressure sensor (not shown). The APC valve 262 is feedback-controlled based on the measured pressure data (in a pressure regulating process). Further, the interior of the processing chamber 201 is heated by the heater 206 so that the susceptor 217 provided in the processing chamber 201 is maintained at a predetermined temperature. At this time, the amount of the current supplied to the heater 206 is feedback-controlled based on temperature data detected by a temperature sensor (not shown), thereby ensuring that the processing chamber 201 has a predetermined temperature distribution (in a temperature controlling process). Thereafter, a sequence of four steps S1c to S1f are sequentially performed, which will be described later.

[Step 1 (Step S1c)]

While operating the vacuum pump 264, the valves va1 to va3 of the raw material gas supply pipe 213a are opened, to thereby flow the HCD gas through the raw material gas supply pipe 213a. A flow rate of the HCD gas flowing into the raw material gas supply pipe 213a is regulated by the MFC 222a. The regulated HCD gas is distributed by the shower head 240 so that it is supplied to the surface of the susceptor 217 and the internal wall of the processing chamber 201 and the like. Then, the regulated HCD gas flows into the exhaust duct 259 and then is exhausted from the exhaust pipe 261 through the exhaust outlet 260 (in a HCD gas supplying process). Simultaneously, the valves vf1 to vf2 and vg1 to vg3 are opened, to thereby flow the inert gas such as $N_2$ gas and the like through the inert gas supply pipes 213f and 213g. A flow rate of the $N_2$ gas flowing into the inert gas supply pipes 213f and 213g is regulated by the respective MFCs 222f and 222g. The regulated $N_2$ gas is supplied, together with the HCD gas, to the surface of the susceptor 217 and the internal wall of the processing chamber 201. Thereafter, the regulated $N_2$ gas flows into the exhaust duct 259 so that it is exhausted from the exhaust pipe 261 through the exhaust outlet 260.

In this case, the APC valve 262 is properly adjusted so that the pressure within the processing chamber 201 is maintained at pressure ranging, e.g., from 10 Pa to 1,000 Pa. A supply flow rate of the HCD gas regulated by the MFC 222a may be in the range of, e.g., 10 to 1,000 sccm. A supply flow rate of the $N_2$ gas regulated by the respective MFCs 222f and 222g may be in the range of, e.g., 200 to 1,000 sccm. The surface of the susceptor 217 and the internal wall of the processing chamber 201 may be exposed to the HCD gas during, e.g., 1 to 120 seconds. The heater 206 is controlled to have a temperature distribution in which a CVD reaction can occur inside the processing chamber 201. In some embodiments, the heater 206 may be controlled so that the temperature within the processing chamber 201 (including the susceptor 217 and the like) is maintained at a temperature in the range of, e.g., 300 to 700 degrees Celsius (° C.); more specifically, 350 to 650 degrees Celsius. When the temperature within the processing chamber 201 is less than 300 degrees Celsius, difficulty occurs with adsorption of the HCD gas on the surface of the susceptor 217 and the internal wall of the processing chamber 201. Also, when the temperature within the processing chamber 201 is greater than 650 degrees Celsius, especially, 700 degrees Celsius, the CVD reaction becomes stronger so that uniformity may be deteriorated. Therefore, the temperature within the processing chamber 201 may be adjusted to be in the range of 300 to 700 degrees Celsius, and more specifically, 350 to 650 degrees Celsius.

By supplying the HCD gas into the processing chamber 201 under the above-mentioned conditions, a silicon layer (Si layer) (used as the silicon-containing layer) whose thickness is in the range from less than one atomic layer thickness to several atomic layer thickness is formed on the members provided in the processing chamber 201, for example, the surface of the susceptor 217, the internal wall of the processing chamber 201, the shower plate 240b, the conductance plate 204, and the like, of the processing chamber 201. In some embodiments, the silicon-containing layer may include a chemical adsorption layer of HCD. The silicon layer may be a generic term referring to discontinuous layers or a thin film which is generated by overlaying discontinuous layers, in addition to a continuous layer made of silicon. In some embodiments, a continuous layer made of silicon may be referred to as a thin film. The chemical adsorption layer of HCD may include a discontinuous chemical adsorption layer in addition to a continuous chemical adsorption layer of HCD molecule. The layer having a thickness less than one atomic layer thickness represents an atomic layer that is discontinuously formed. Under a condition that the HCD gas does not undergo self-decomposition, HCD is adsorbed on the surface of the susceptor 217 and the like so that the chemical adsorption layer of HCD is formed. On the other hand, under a condition that the HCD gas undergoes self-decomposition, silicon molecules may be deposited on the surface of the susceptor 217 and the like so that the silicon layer is formed. In case that a thickness of the silicon-containing layer formed on the surface of the susceptor 217 and the like exceeds several atomic layer thickness, oxidation to be performed at Step 3 (Step S1e), which will be described later, does not reach the entire of the silicon-containing layer. A minimum value of the silicon-containing layer, which is formable on the surface of the susceptor 217 and the like, cannot be significantly less than one atomic layer thickness. Therefore, the thickness of the silicon-containing layer may range from (slightly) less than one atomic layer thickness to several atomic layer thickness.

In addition to the HCD gas, a raw material containing Si may include, for example, an inorganic raw material such as a dichloro-silane ($SiH_2Cl_2$, abbreviation: DCS) gas, a tetra-chloro-silane ($SiCl_4$, abbreviation: TCS) gas, a monosilane ($SiH_4$) gas, or the like, and an organic raw material such as an aminosilane-based tetrakis-dimethylamino-aminosilane (Si (N(CH$_3$)$_2$)$_4$, abbreviation: 4DMAS) gas, a tris-dimethylamino-silane (Si(N(CH$_3$)$_2$)$_3$H, abbreviation: 3DMAS) gas, a bis-diethylamino-silane (Si(N(C$_2$H$_5$)$_2$)$_2$H$_2$, abbreviation: 2DEAS) gas, a bis-tertiary-butyl-amino-silane (SiH$_2$(NH(C$_4$H$_9$))$_2$, abbreviation: BTBAS) gas, or the like. Also, the inert gas may include a rare gas such as Ar gas, He gas, Ne gas, Xe gas, or the like, in addition to the N$_2$ gas.

[Step 2 (Step S1d)]

Once the silicon-containing layer is formed on the surface of the susceptor 217 and the like, the valves va1 to va3 of the raw material gas supply pipe 213a are closed to stop the supply of the HCD gas. At this time, while the APC valve 262 of the exhaust pipe 261 is opened, the interior of the processing chamber 201 is vacuum-exhausted by the vacuum pump 264 such that the HCD gas remaining in the processing chamber 201 is exhausted. If the inert gas is supplied into the interior of the processing chamber 201 while the valves vf1 to vf3 and vg1 to vg3 are kept opened, the exhaust effect of the remaining HCD gas is further increased (in a purge process). During such operation, the temperature of the heater 206 is controlled so that the temperature within the processing chamber 201 is maintained at a temperature distribution having the range of 300 to 700 degrees Celsius, and more specifically, 350 to 650 degrees Celsius, similar to the supply of the HCD gas.

[Step 3 (Step S1e)]

After the residual gas within the processing chamber 201 is removed, the valves vc1 to vc3 of the oxygen-containing gas supply pipe 213c, and the valves vf1 to vf3 and vg1 to vg3 of the inert gas supply pipes 213f and 213g are opened, to thereby flow the O$_2$ gas through the oxygen-containing gas supply pipe 213c, and the N$_2$ gas through the inert gas supply pipe 213f and 213g. A flow rate of the O$_2$ gas flowing into the oxygen-containing gas supply pipe 213c is regulated by the MFC 222c. Flow rates of the N$_2$ gas flowing into the inert gas supply pipes 213f and 213g are respectively regulated by the MFCs 222f and 222g. The regulated O$_2$ and N$_2$ gases are distributed by the shower head 240 and then supplied to the surface of the susceptor 217, the internal wall of the processing chamber 201, and the like. Thereafter, the distributed O$_2$ and N$_2$ gases flows through the exhaust duct 259 so that it is exhausted from the exhaust pipe 261 through the exhaust outlet 260.

Simultaneously, the valves vd1 to vd3 of the hydrogen-containing gas supply pipe 213d are opened, to thereby flow the H$_2$ gas through the hydrogen-containing gas supply pipe 213d. A flow rate of the H$_2$ gas flowing into the hydrogen-containing gas supply pipe 213d is regulated by the MFC 222d. The regulated H$_2$ gas is distributed together with the O$_2$ gas and the N$_2$ gas by the shower head 240 so that it is supplied to the surface of the susceptor 217, the internal wall of the processing chamber 201, and the like. Thereafter, the distributed H$_2$ gas flows through the exhaust duct 259 so that it is exhausted from the exhaust pipe 261 through the exhaust outlet 260 (in an O$_2$ and H$_2$ gases supply process).

During this time, the APC valve 262 is properly adjusted so that the pressure within the processing chamber 201 is maintained at below atmospheric pressure, for example, a pressure ranging from 1 to 1,000 Pa. The supply flow rate of the O$_2$ gas regulated by the MFC 222c may be in the range of, e.g., 100 to 10,000 sccm. The supply flow rate of the H$_2$ gas regulated by the MFC 222d may be in the range of, e.g., 100 to 10,000 sccm. The supply flow rates of the H$_2$ gas respectively regulated by the MFCs 222f and 222g may be in the range of, e.g., 200 to 1,000 sccm. Further, the surface of the susceptor 217, the internal wall of the processing chamber 201 and the like may be exposed to the O$_2$ gas and the H$_2$ gas during 1 to 120 seconds, for example. The temperature of the heater 206 is controlled so that the temperature within the processing chamber 201 (including the susceptor 217 and the like) is maintained at a temperature in the range of, e.g., 350 to 1,000 degrees Celsius.

Under the temperature condition as described above, it has been shown that the H$_2$ gas is added to the O$_2$ gas under a reduced-pressure atmosphere, thus improving oxidizability. Further, if the temperature within the processing chamber 201 is extremely low, it has been shown that the oxidizability is not improved.

In view of a throughput, the temperature of the heater 206 may be controlled so that the temperature within the processing chamber 201 (including the susceptor 217 and the like) is maintained at the same temperature range as that of Step 1 (Step S1c) for supplying the HCD gas, which is effective in obtaining the improved oxidizability. In other words, the temperature range Step 3 (Step S1e) may be maintained the same as that of Step 1 (Step S1c). For example, the temperature of the heater 206 may be controlled so that the temperature of the susceptor 217 and the like, i.e., the temperature within the processing chamber 201, at Step 1 (Step S1c) and Step 3 (Step S1e) is maintained at a constant temperature within the range of 350 to 700 degrees Celsius, more specifically, 350 to 650 degrees Celsius.

Further, the temperature of the heater 206 may be controlled so that the temperature within the processing chamber 201 is uniformly maintained in a series of Step 1 (Step S1c) to Step 4 (Step S1f), which will be described later. As an example, the temperature of the heater 206 may be controlled so that the temperature within the processing chamber 201 is maintained at a constant temperature within the range of 350 to 700 degrees Celsius, more specifically, 350 to 650 degrees Celsius, in the series of Step 1 (Step S1c) to Step 4 (Step S1f), which will be described later. To obtain the improvement of oxidizability by adding the O$_2$ gas to the H$_2$ gas under a reduced-pressure atmosphere, the temperature within the processing chamber 201 is required to be maintained at a temperature of 350 degrees Celsius or higher. As an example, the temperature within the processing chamber 201 may be maintained at a temperature of 400 degrees Celsius or higher, and especially, 450 degrees Celsius or higher. Setting the temperature within the processing chamber 201 to 400 degrees Celsius or higher results in a stronger oxidizability than the oxidizability obtainable in an O$_3$ oxidation process which is performed at a temperature of 400 degrees Celsius or higher. Further, setting the temperature within the processing chamber 201 to 450 degrees Celsius or higher results in greater oxidizability than the oxidizability obtainable in an O$_2$ plasma oxidation process which is performed at a temperature of 450 degrees Celsius or higher.

By supplying the O$_2$ gas and the H$_2$ gas into the processing chamber 201 under the above-mentioned conditions, the O$_2$ gas and the H$_2$ gas are activated and reacted in the state of non-plasma under a heated reduced-pressure atmosphere, so that an oxidizing species containing O (oxygen) (i.e., an atomic oxygen and the like) is produced. Through mainly the oxidizing species, an oxidation process is performed on the silicon-containing layer that has been formed on the surface of the susceptor 217 and the internal wall of the processing chamber 201 during Step 1 (Step S1c). Through the oxidation process, the silicon-containing layer is modified (or changed) to a silicon oxide layer (SiO$_2$ layer, hereinafter simply referred to as a SiO layer).

In some embodiments, the oxygen-containing gas may include, e.g., an ozone (O$_3$) or the like, in addition to the oxygen (O$_2$) gas. A measurement was conducted by the present inventor to confirm effects obtained by adding a hydrogen-containing gas to a nitrogen monoxide (NO) gas or a nitrogen dioxide ($N_2O$) gas. The measurement showed that there was no improvement of the oxidizability compared to the case of singularly supplying a nitrogen monoxide (NO) gas or a nitrogen dioxide ($N_2O$) gas. In other words, a nitrogen-free oxygen-containing gas (i.e., a gas containing oxygen not nitrogen) may be used as the oxygen-containing gas. As an example, a deuterium ($D_2$) gas may be used as the hydrogen-containing gas in addition to the hydrogen ($H_2$) gas. In addition, use of an ammonia ($NH_3$) gas or a methane ($CH_4$) gas may cause insertion of a nitrogen (N) impurity or a carbon (C) impurity into the film. Specifically, for the hydrogen-containing gas, a hydrogen-containing gas with no other chemical elements (containing hydrogen or deuterium with no other chemical elements) may be used. Consequently, in some embodiments, at least one selected from a group consisting of the $O_2$ gas and the $O_3$ gas may be used as the oxygen-containing gas, and at least one selected from a group consisting of the $H_2$ gas and the $D_2$ gas may be used as the hydrogen-containing gas.

[Step 4 (Step S1*f*)]

Once the silicon-containing layer is modified to the silicon oxide layer, the valves vc1 to vc3 of the oxygen-containing gas supply pipe 213*c* are closed to stop the supply of the $O_2$ gas. In addition, the valves vd1 to vd3 of the hydrogen-containing gas supply pipe 213*d* are closed to stop the supply of the $H_2$ gas. At this time, while the APC valve 262 of the exhaust pipe 261 is closed, the interior of the processing chamber 201 is vacuum-exhausted by means of the vacuum pump 264 so that the remaining $O_2$ gas or $H_2$ gas is exhausted from the interior of processing chamber 201. If the inert gas is supplied into the processing chamber 201 while the valves vf1 to vf3 and vg1 to vg3 are kept to be opened, the exhaust effect of the remaining $O_2$ gas and $H_2$ gas may be further increased. The temperature of the heater 206 is controlled so that the temperature within the processing chamber 201 is maintained at a temperature within 350 to 700 degrees Celsius, more specifically, 350 to 650 degrees Celsius, which is identical to the temperature within the processing chamber 201 when the $O_2$ gas and the $H_2$ gas are supplied.

[Cycling Step S1*g*]

The above-mentioned Step 1 (Step S1*c*) to Step 4 (Step S1*f*) are set as one cycle operation. The cycle operation is repeatedly performed a predetermined number of times (Step S1*g*). In this way, the SiO film having a predetermined thickness may be formed on the members provided in the processing chamber 201, for example, the surface of the susceptor 217, the internal wall of the processing chamber 201, the shower plate 240*b*, the conductance plate 204, and the like.

The SiO film formed at the step S1 has a high etching resistance with respect to a $ClF_3$ gas and the like, in comparison with the SiO film formed on the surface of the SiC film by a CVD process. In other words, according to the step S1, it is possible to form the SiO film having a high etching resistance, i.e., a low etching rate when performing the cleaning process, compared with the case of forming the SiO film on the SiC film through CVD by using a raw material such as a tetra-ethoxysilane ($Si(OC_2H_5OH)_4$, abbreviation: TEOS) gas and the like, or a DCS gas and a $N_2O$ gas.

In addition, according to the step S1, the concentration of impurities contained inside the SiO film can be reduced in comparison with the formation of the SiO film on the surface of the SiC film through the CVD process or a thermal oxidation process. For example, in case that the SiO film is formed on the SiC film through the CVD process by using a raw material such as the TEOS gas and the like, impurities such as carbon (C) or the like contained in TEOS may be adulterated in the SiO film being formed. Also, in case that the surface of the SiC film is oxidized to form the SiO film through the thermal oxidation process by using the $O_2$ gas and the like, metal contamination materials such as iron (Fe), nickel (Ni), and the like (i.e., impurities contained in the SiC film) are adulterated in the SiO film being formed. On the other hand, according to the step S1, since the SiO film is formed by repeatedly performing a sequence of forming the silicon-containing later on the SiC film by using the HCD gas, and oxidation-processing the silicon-containing layer by using the $O_2$ gas and the $H_2$ gas under an atmosphere having pressure below atmospheric pressure, and the SiC film is not oxidized, it is possible to decrease an impurity concentration in the film.

Further, according to the step S1, the SiO film can be formed at a lower temperature compared to the case of forming the SiO film on the surface of the SiC film through CVD or thermal oxidation.

In addition, a thickness of the SiO film formed at the step S1 is determined in consideration of an etching selectivity with respect to films (i.e., a SiN film and the like) to be formed on the wafer 200 in a thin film forming step S4 (which will be described later). For example, the thickness of the SiO film may have the range of 250 to 2,000 angstroms (Å). When the SiN film is formed on the wafer 200, a cleaning process is generally required at the time when an accumulated thickness of the SiN film in the processing chamber 201 reach about 5000 angstroms. As described later, an etching selectivity (SiN/SiO) of the SiN film to the SiO film, which is obtainable according to the present embodiment, is 2.5 to 20 or more. Then, stable protection of the CVD-SiC film underlying the SiO film requires setting the thickness of the SiO film to be formed at the step S1 to at least 250 to 2,000 angstroms. If the thickness of the formed SiO film is greater than 2,000 angstroms, a time period during which the SiO film is formed may be significantly prolonged (for example, for one day or more), which causes a accordingly prolonged downtime of the substrate processing apparatus. This may affect the productivity of the apparatus.

[Purge Step S1*h*]

Once the SiO film having a predetermined thickness is formed, the valves vf1 to vf3 and vg1 to vg3 are opened so that the $N_2$ gas (used as an inert gas) is supplied into the processing chamber 201 through each of the inert gas supply pipes 213*f* and 213*g*. The supplied $N_2$ gas is exhausted from the exhaust pipe 261 through the exhaust duct 259 and the exhaust outlet 260. The $N_2$ gas used herein serves as a purge gas so that the interior of the processing chamber 201 is purged by means of the inert gas. As such, remaining gas in the processing chamber 201 is removed therefrom (in a purge process).

<Modification Step S2>

In this step, a modification process is performed on the SiO film formed at the step S1 (i.e., the SiO film forming step) under an atmosphere having pressure below atmospheric pressure by using the $O_2$ gas and the $H_2$ gas. The modification step S2 will be described in detail herein.

[Pressure Regulating and Temperature Controlling Step S2*a*]

After the processing chamber 201 has been purged, the processing chamber 201 is vacuum-exhausted by the vacuum pump 264 so that a pressure therein is maintained at a predetermined pressure (or a vacuum degree). The pressure within the processing chamber 201 is measured by a pressure sensor (not shown). The APC valve 262 is feedback-controlled based on the measured pressure data (in a pressure regulating process). In addition, the interior of the processing chamber 201 (including the susceptor 217 and the like) is heated up to a predetermined temperature by the heater 206. In this case, the amount of the current supplied to the heater 206 is feedback-controlled based on temperature data detected by a temperature sensor (not shown), thereby ensuring that the processing chamber 201 has a predetermined temperature distribution (in a temperature controlling process). Further, the operation of the heater 206 is controlled so that the temperature of the susceptor 217 is equal to or higher than the temperature thereof during the SiO film forming step S1. In one embodiment, the operation of the heater 206 is controlled so that the temperature of the susceptor 217 is higher than the temperature thereof during the SiO film forming step S1.

[$O_2$ and $H_2$ Gases Supplying Step S2b]

The valves vc1 to vc3 of the oxygen-containing gas supply pipe 213c are opened so that the $O_2$ gas flows through the oxygen-containing gas supply pipe 213c. A flow rate of the $O_2$ gas flowing into the oxygen-containing gas supply pipe 213c is regulated by the MFC 222c. The regulated $O_2$ gas is distributed by the shower head 240 so that it is supplied into the processing chamber 201. Concurrently, the valves vd1 to vd3 of the hydrogen-containing gas supply pipe 213d are opened, to thereby flow the $H_2$ gas through the hydrogen-containing gas supply pipe 213d. A flow rate of the $H_2$ gas flowing into the hydrogen-containing gas supply pipe 213d is regulated by the MFC 222d. The regulated $H_2$ gas is distributed by the shower head 240 so that it is supplied into the processing chamber 201. In addition, the $H_2$ gas is mixed with the $O_2$ gas while passing through the oxygen-containing gas supply pipe 213c and the shower head 240. Specifically, the mixture of the $O_2$ gas and the $H_2$ gas is supplied into the processing chamber 201. The mixture of the $O_2$ gas and the $H_2$ gas is supplied into the processing chamber 201 being in a heated reduced-pressure condition, and then is exhausted from the exhaust pipe 261 through the exhaust duct 259 and the exhaust outlet 260 (in a $O_2$+$H_2$ gas supplying process).

In some embodiments, the valves vg1 to vg3 of the inert gas supply pipe 213g are opened such that the $N_2$ gas (used as an inert gas) may be supplied into the processing chamber 201 through the inert gas supply pipe 213g. Alternatively, the valves vf1 to vf3 of the inert gas supply pipe 213g are opened such that the $N_2$ gas (used as an inert gas) may be supplied into the processing chamber 201 through the inert gas supply pipe 213f. A flow rate of the $N_2$ gas is regulated by the MFC 222g or 222f and is distributed by the shower head 240, so that it is supplied into the processing chamber 201. In this case, a mixture of the $O_2$ gas, the $H_2$ gas and the $N_2$ gas is supplied into the processing chamber 201. In some embodiments, rare gas such as Ar gas, He gas, Ne gas, Xe gas, and the like, may be used as the inert gases, in addition to the $N_2$ gas.

Then, by appropriately controlling the APC valve 262, the pressure within the processing chamber 201 is maintained below atmospheric pressure, e.g., in the range of 1 to 1,330 Pa. Under the control of the MFC 222c, the supply flow rate of the $O_2$ gas is adjusted to be in the range of, e.g., 100 to 10,000 sccm (or 0.1 to 10 slm). Further, under the control of the MFC 222d, the supply flow rate of the $H_2$ gas is adjusted to be in the range of e.g., 100 to 10,000 sccm (or 0.1 to 10 slm). In addition, the susceptor 217 and the like are exposed to the $O_2$ gas and the $H_2$ gas during, e.g., 1 to 600 minutes. The temperature of the heater 206 is controlled so that the temperature of the susceptor 217 and the like is maintained at a temperature within the range of, e.g., 350 to 1,200 degrees Celsius.

It is found that, in the temperature range as described above, when the $H_2$ gas is added to the $O_2$ gas under a reduced-pressure atmosphere, an impurity residing within the film is substantially removed in comparison with the case of supplying only the $O_2$ gas into the processing chamber 201 (in a $O_2$ annealing process). Also, it is found that an impurity residing within the film is substantially removed in comparison with the case of supplying only the $N_2$ gas into the processing chamber 201 under atmospheric pressure (in a $N_2$ annealing process).

Further, in consideration of a throughput, the heater 206 may be controlled to maintain the temperature of the susceptor 217 and the like in the identical temperature range during the SiO film forming step S1 and the modification step S2. In other words, the temperature within the processing chamber 201 may be maintained in the identical temperature range during the SiO film forming step S1 and the modification step S2. In this case, during the SiO film forming step S1 and the modification step S2, the heater 206 is controlled so that the temperature within the processing chamber 201 (including the susceptor 217 and the like) is maintained at a temperature within the range of 350 to 700 degrees Celsius, more specifically, 350 to 650 degrees Celsius.

However, in the modification step S2, maintaining the temperature within the processing chamber 201 (including the susceptor 217 and the like) at a high temperature improves an effect of removing an impurity residing in the film, and also improves an etching resistance of the SiO film. For this reason, the temperature of the susceptor 217 during the modification S2 may be maintained to be higher than the temperature of the susceptor 217 during the SiO film forming step S1.

By supplying the $O_2$ gas and the $H_2$ gas into the processing chamber 201 with the above-mentioned conditions, the $O_2$ gas and the $H_2$ gas are thermally activated and reacted in the state of non-plasma under a heated reduced-pressure atmosphere, thereby generating a reaction species containing O, i.e., an atomic oxygen. By mainly the reaction species, a modification process is performed on the SiO film that is formed on the surface of the susceptor 217 and the like during the SiO film forming step S1. With this modification process, impurities residing in the SiO film are removed. As described above, through the modification process, the removal effect of in-film impurity can be dramatically increased in comparison with the $O_2$ annealing process or the $N_2$ annealing process. In other words, by adding the $H_2$ gas to the $O_2$ gas under a reduced-pressure atmosphere, the removal effect of in-film impurity can be dramatically increased in comparison with the $O_2$ annealing and the $N_2$ annealing process.

As described above, by forming the SiO film through a method shown in the SiO film forming step S1, the concentration of impurities contained in the SiO film can be reduced and an etching resistance of the SiO film can be increased. Moreover, application of the modification process according to the step S2 on the SiO film further reduces the concentration of impurities contained in the SiO film and also improves the etching resistance of the SiO film. In other words, although it is effective to reduce the concentration of impurities and to increase the etching resistance by forming the SiO film according to the above-mentioned method (i.e., the SiO film forming step S1) without performing the modification process according to the step S2, the additional modification process according to the step S2 is also effective to further reduce the concentration of impurities contained and to increase the etching resistance.

According to the step S2, at least one of the $O_2$ gas and the $H_2$ gas may be activated in the state of plasma to be flowed. This generates a reaction species having higher energy. The modification process based on the reaction species further improves the etching resistance. When both the $O_2$ gas and the $H_2$ gas are activated in the state of plasma, a high frequency power to be applied is set to be in the range of, e.g., 50 to 1,000

W. Other process conditions are similar to the above-mentioned process conditions. Within the above-mentioned temperature range, the $O_2$ gas and the $H_2$ gas are thermally activated so that they are sufficiently reacted with each other, thus producing a sufficient amount of reaction species. Consequently, even though the $O_2$ gas and the $H_2$ gas are thermally activated in this state of non-plasma, a sufficient modification effect (or impurity removal effect) can be obtained. In addition, it is possible to induce a soft reaction by thermally activating and supplying the $O_2$ gas and the $H_2$ gas, which makes the above-mentioned modification process softly.

For the oxygen-containing gas and the hydrogen-containing gas used in this step S2, the oxygen-containing gas and the hydrogen-containing gas used in the SiO film forming step S1 may be used, respectively.

[Purge Step S2c]

After the modification process, valves vf1 to vf3 and vg1 to vg3 are opened so that the $N_2$ gas (used as an inert gas) is supplied into the processing chamber 201 through the inert gas supply pipe 213f and the inert gas supply pipe 213g, followed by being exhausted from the exhaust pipe 261 through the exhaust duct 259 and the exhaust outlet 260. The $N_2$ gas functions as a purge gas such that the interior of the processing chamber 201 is purged with the inert gas, which removes the gas residing within the processing chamber 201 (in a purging process).

<Pre-Coating Step S3>

Subsequently, performed is a process (i.e., pre-coating process) of coating the internal wall of the processing chamber 201 with a film (i.e., SiN film) that is identical to a thin film formed on the wafer 200 in the thin film forming step S4 (which will be described later). In one embodiment, a SiON film, whose composition ratio gradually changes from SiO to SiN, may be formed on the SiO film. In addition, the pre-coating step S3 is similar to the thin film forming step S4 (which will be described later) except for performing a film-forming process without loading the wafer 200 into the processing chamber 201. Thus, a description thereof is omitted.

<Thin Film Forming Step S4>

Figure 1A:
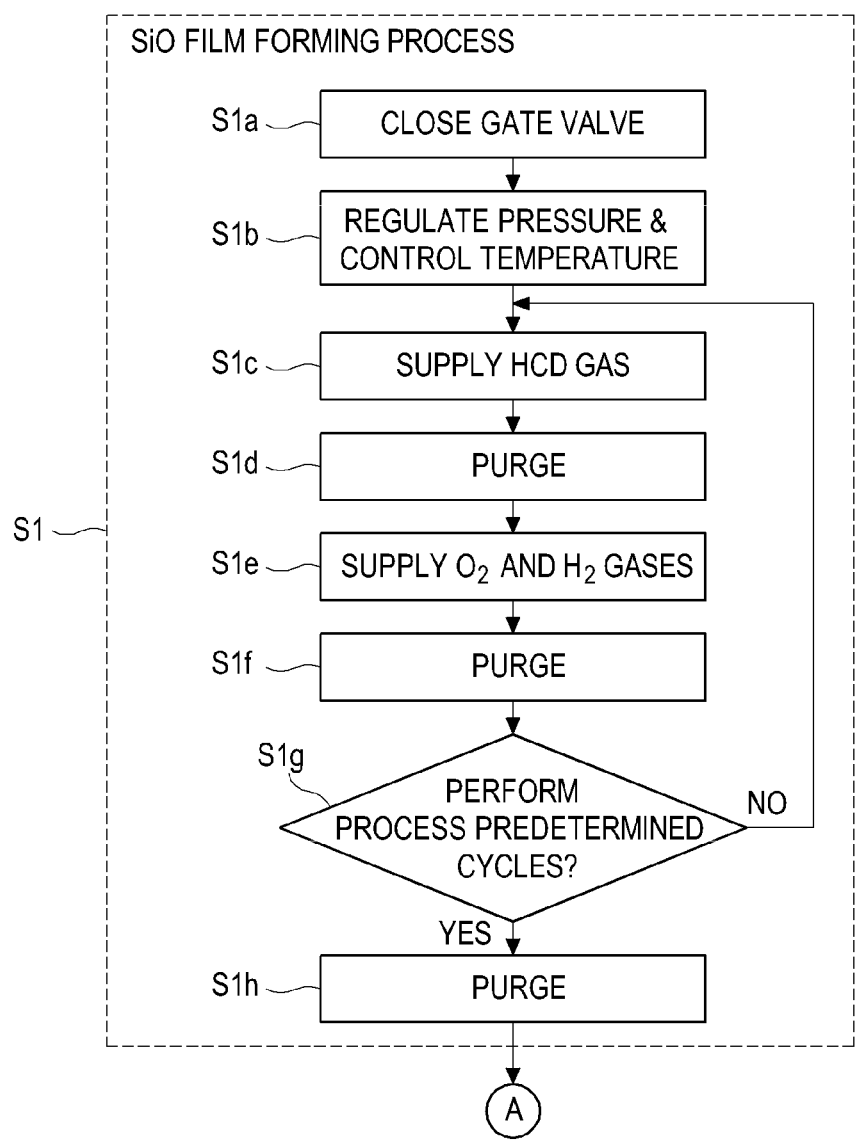
FIGS. 1A to 1D show a flowchart of a substrate processing procedure in accordance with one embodiment of the present disclosure.
Figure 1B:
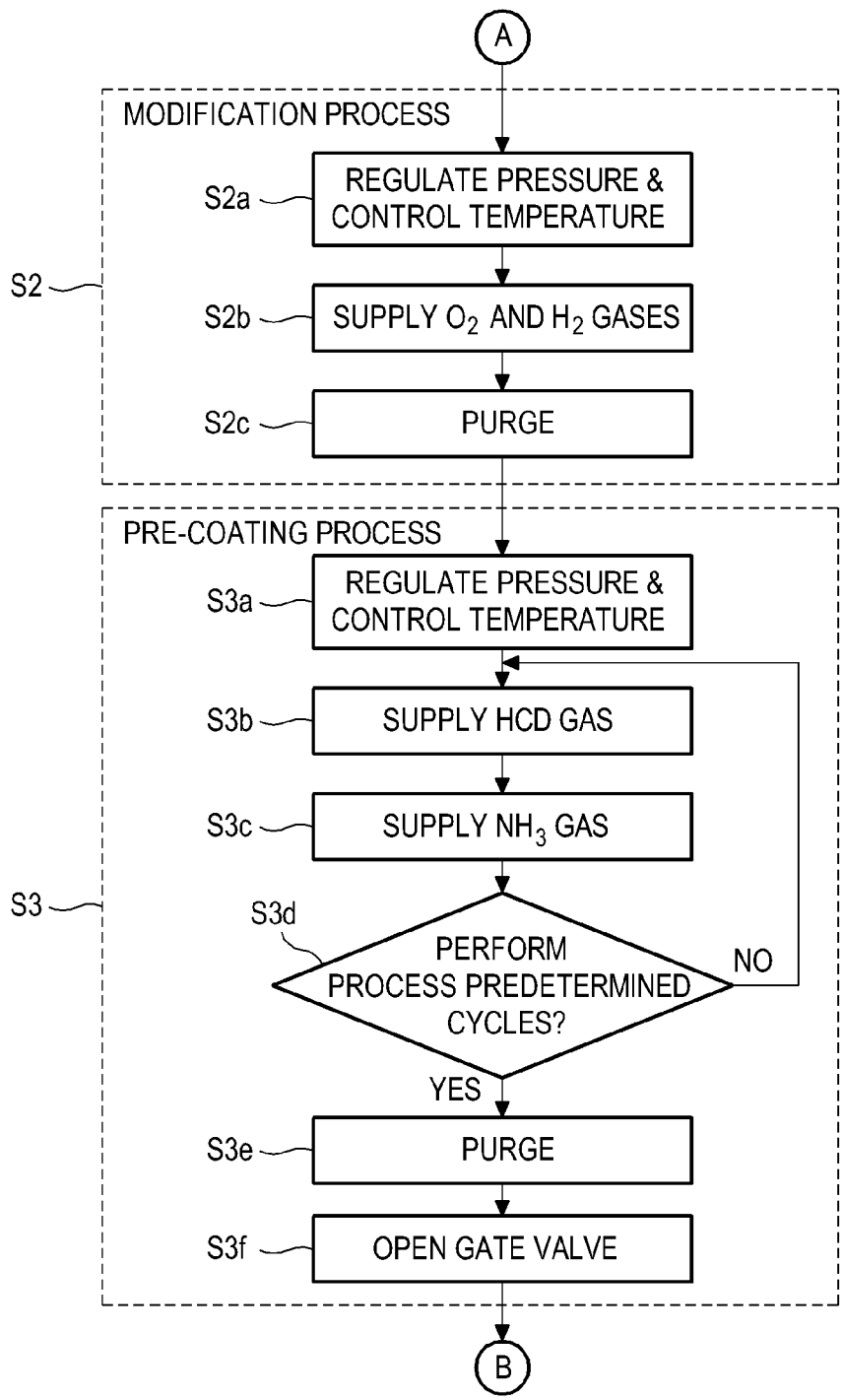
Figure 1C:
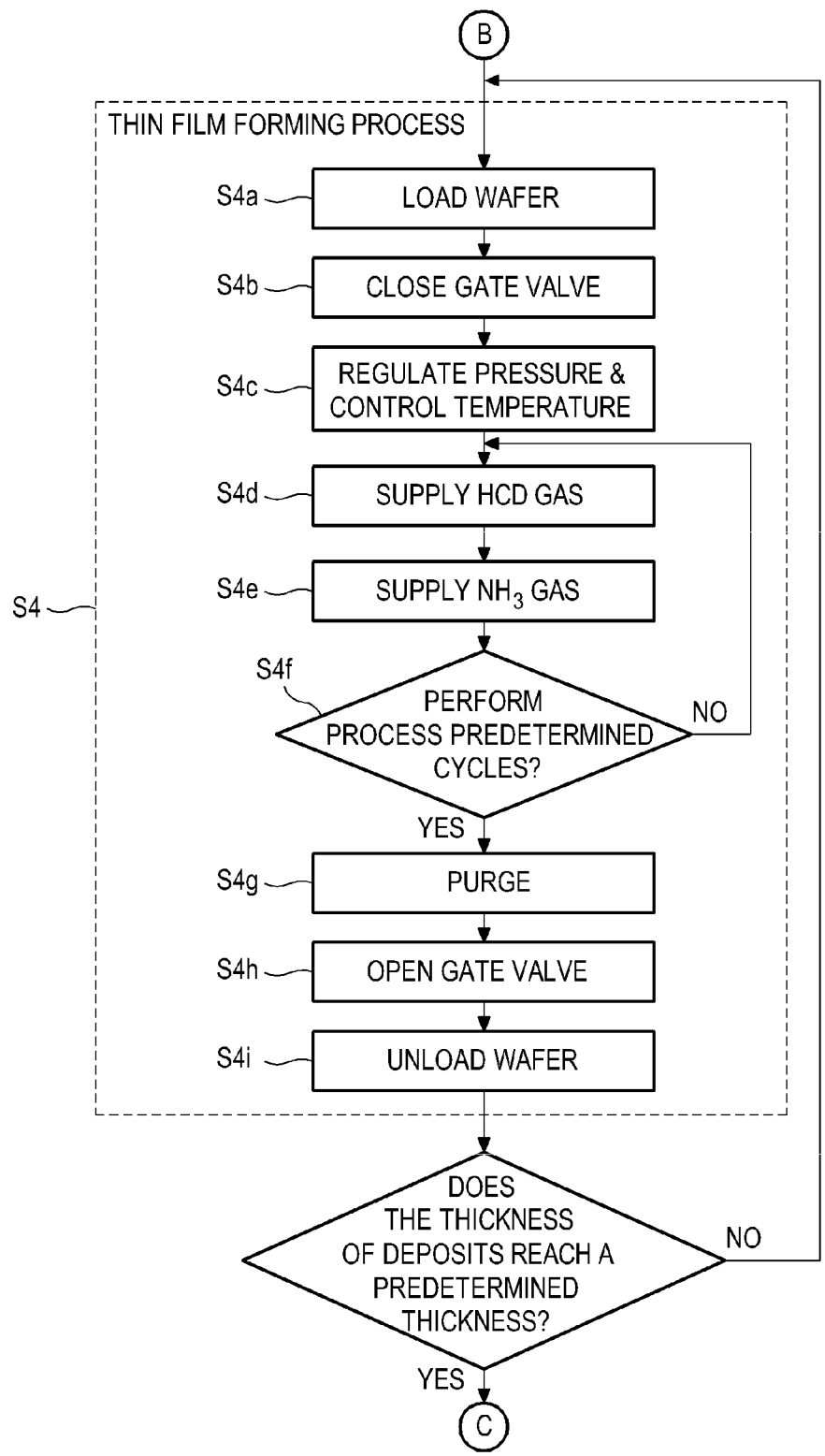
Figure 1D:
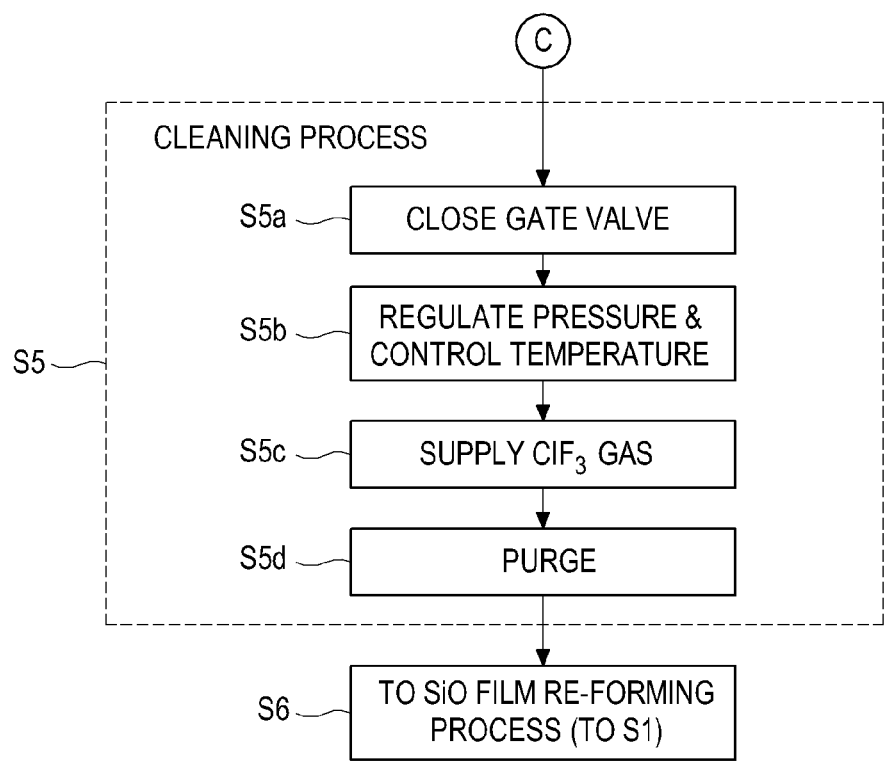

Upon completion of the pre-coating process on the internal wall of the processing chamber 201, performed is a process (step S4) of loading the wafer 200 into the processing chamber 201 and forming the SiN film on the wafer 200. As shown in FIG. 1B, the step S4 includes steps S4d and S4e constituting one cycle. At the step S4d, under a condition for which a CVD reaction is generated within the processing chamber 201 accommodating the wafer 200 therein, the HCD gas (used as the silicon-containing gas) is supplied into the processing chamber 201 and are exhausted therefrom, so that the silicon-containing layer is formed on the wafer 200. At the step S4e, the $NH_3$ gas (used as the nitride-containing gas) is supplied into the processing chamber 201 and is exhausted therefrom, followed by subjecting the silicon-containing layer to a nitridation process, thereby forming a silicon nitride layer on the wafer 200. This cycle is performed in one or more iterations such that a silicon nitride film (SiN film) having a predetermined thickness is formed. In the following, the film forming step S4 will described in detail.

[Wafer Loading Step S4a, Gate Valve Closing Step S4b]

The elevation mechanism 207b is operated to lower the susceptor 217 to the wafer transferring position as shown in FIG. 4. The gate valve 251 is opened and then the wafer 200 is loaded into the processing chamber 201 to be placed on the lift pins 208b. After that, the gate valve 251 is closed and the elevation mechanism 207b is operated, so that the wafer 200 is lifted up to the wafer process position as shown in FIG. 3 to be loaded on the susceptor 217.

[Pressure Regulating & Temperature Controlling Step S4c]

The interior of the processing chamber 201 is vacuum-exhausted by the vacuum pump 264 so that the pressure therein is maintained at a predetermined pressure (or a predetermined vacuum degree). In this case, the pressure within the processing chamber 201 is measured by a pressure sensor (not shown). The APC valve 262 is feedback-controlled based on the measured pressure data (in a pressure regulating process). In addition, the heater 206 performs a heating operation so that the interior of the processing chamber 201 (including the wafer 200) is maintained at a predetermined temperature. At this time, the amount of the current supplied to the heater 206 is feedback-controlled based on temperature data detected by a temperature sensor (not shown), thereby ensuring that the processing chamber 201 has a predetermined temperature distribution (in the temperature controlling process). Thereafter, a sequence of the steps S4d and S4e are sequentially performed, which will be described later.

[Step 1 (Step S4d)]

While the vacuum pump 264 is operating, the valves va1 to va3 of the raw material gas supply pipe 213a are opened, to thereby flow the HCD gas into the raw material gas supply pipe 213a. A flow rate of the HCD gas flowing into the raw material gas supply pipe 213a is regulated by the MFC 222a. The regulated HCD gas is distributed by the shower head 240 so that it is supplied to the surface of the wafer 200. Then, the distributed HCD gas flows through the exhaust duct 259 so that it is exhausted from the exhaust pipe 261 through the exhaust outlet 260 (in a HCD gas supplying process). Concurrently, the valves vf1 to vf3 and vg1 to vg3 are opened, to thereby flow an inert gas such as the $N_2$ gas or the like into the inert gas supply pipes 213f and 213g. A flow rate of the $N_2$ gas flowed through the inert gas supply pipes 213f and 213g is regulated by the MFCs 222f and 222g. The regulated $N_2$ gas is supplied, together with the HCD gas, to the surface of the wafer 200. Then, the $N_2$ gas flows through the exhaust duct 259 so that it is exhausted from the exhaust pipe 261 through the exhaust outlet 260.

At this time, by appropriately controlling the APC valve 262, the pressure within the processing chamber 201 is adjusted to be in the range of, e.g., 10 to 1,000 Pa. A supply flow rate of the HCD gas controlled by the MFC 222a is regulated to be in the range of, e.g., 10 to 1,000 sccm. Supply flow rates of the $N_2$ gases controlled by the MFCs 222f and 222g are respectively regulated to be in the range of, e.g., 200 to 1,000 sccm. A time period during which the wafer 200 is exposed to the HCD gas, i.e., a gas supply time (or irradiation time), is set to be in the range of e.g., 1 to 120 seconds. At this time, the heater 206 is adjusted so that a temperature at which a CVD reaction is caused is maintained within the processing chamber 201, specifically, a temperature of the wafer 200 is maintained at a temperature in the range of, e.g., 300 to 700 degrees Celsius, more specifically, 350 to 650 degrees Celsius. If the temperature of the wafer 200 is less than 300 degrees Celsius, it is difficult for HCD to be adsorbed on the wafer 200. If the temperature of the wafer 200 is greater than 650 degrees Celsius, especially, 700 degrees Celsius, the CVD reaction becomes strong, which results in a poor uniformity. Therefore, the temperature of the wafer 200 may be adjusted to be in the range of 300 to 700 degrees Celsius, more specifically, 350 to 650 degrees Celsius.

Through the supply of the HCD gas, a first silicon-containing layer (used as a first element) is formed on a base film placed on the surface of the wafer 200. That is, a silicon layer (Si layer) (used as the silicon-containing layer) having a thickness from less than one atomic layer thickness to several atomic layer thickness is formed on the wafer 200 (e.g., the base film). In some embodiments, the silicon-containing layer may be a chemical adsorption layer of HCD. Further, the silicon itself is a solid element. Here, the silicon layer may include discontinuous layers or a thin film which is generated by overlaying discontinuous layers, in addition to a continuous layer made of silicon. In some embodiments, the continuous layer made of silicon may be referred to as a thin film. The chemical adsorption layer of HCD may include a discontinuous chemical adsorption layer in addition to a continuous chemical adsorption layer of HCD molecule. In addition, when the thickness of the silicon-containing layer formed on the wafer 200 exceeds several atomic layer thickness, a nitridation action to be performed in Step 2 (Step S4e) (which will be described later) does not reach the entire of the silicon-containing layer. Further, a minimum value of the silicon-containing layer that can be formed on the wafer 200 cannot be significantly less than one atomic layer. Therefore, the thickness of the silicon-containing layer may be set to be within the range from (slightly) less than one atomic layer thickness to the several atomic layer thickness. In addition, for the condition that the HCD gas is self-decomposed, the silicon layer is formed by deposition of silicon on the wafer 200. For the condition that the HCD gas is not self-decomposed, the chemical absorption layer of HCD is formed by chemical adsorption of HCD on the wafer 200. Further, in light of improvement of a film forming rate, the silicon layer may be formed on the wafer 200 rather than forming the chemical absorption layer of HCD on the wafer 200.

After the silicon-containing layer is formed on the base film placed on the surface of the wafer 200, the valves va1 to va3 of the raw material gas supply pipe 213a are closed so that the supply of the HCD gas is stopped. At this time, while the APC valve 262 of the exhaust pipe 261 is being opened, the interior of the processing chamber 201 is vacuum-exhausted by the vacuum pump 264 so that unreacted HCD gas or the HCD gas remaining after being used in the formation of the silicon-containing layer, which is retained within the processing chamber 201, is discharged from the processing chamber 201. Meanwhile, by keeping the valves vf1 to vf3 and vg1 to vg3 opened, the supply of the $N_2$ gas into the processing chamber 201 is maintained. Thus, it is possible to increase an effect of discharging from the processing chamber 201, the unreacted HCD gas or the HCD gas remaining after being used in the formation of the silicon-containing layer, which is retained within the processing chamber 201.

For the silicon-containing gas and the inert gas, in some embodiments, one similar to the silicon-containing gas used in the SiO film forming step S1 may be used.

[Step 2 (Step S4e)]

Upon removal of the residual gas within the processing chamber 201, the valves vb1 to vb3 of the reaction gas supply pipe 213b are opened so that the $NH_3$ gas flows through the reaction gas supply pipe 213b. A flow rate of the $NH_3$ gas flowing into the reaction gas supply pipe 213b is regulated by the MFC 222b. The regulated $NH_3$ gas is distributed by the shower head 240 to be supplied to the surface of the wafer 200. Then, the distributed $NH_3$ gas flows through the exhaust duct 259 so that it is exhausted from the exhaust pipe 261 through the exhaust outlet 260. At this time, while keeping the valves vf1 to vf3 and vg1 to vg3 opened, inert gas such as the $N_2$ gas or the like is flowed into the inert gas supply pipes 213f and 213g. Flow rates of the $N_2$ gas flowing into the inert gas supply pipes 213f and 213g are respectively regulated by the MFCs 222f and 222g. The regulated $N_2$ gas is supplied, together with the $NH_3$ gas, to the surface of the wafer 200, followed by flowing through the exhaust duct 259, so that it is exhausted from the exhaust pipe 261 through the exhaust outlet 260.

At this time, by appropriately adjusting the APC valve 262, the pressure within the processing chamber 201 is adjusted to be in the range of, e.g., 50 to 3,000 Pa. A supply flow rate of the $NH_3$ gas controlled by the MFC 222b is adjusted to be in the range of, e.g., 100 to 10,000 sccm. Supply flow rates of the $N_2$ gases controlled by the MFCs 222f and 222g are respectively regulated to be in the range of, e.g., 200 to 1,000 sccm. A time period during which the wafer 200 is exposed to the HCD gas, i.e., a gas supply time (or irradiation time), is set to be in the range of e.g., 1 to 120 seconds. Similarly to the above step 1 (S4d), the temperature of the heater 206 is adjusted so that the temperature of the wafer 200 is maintained at a temperature within the range of, e.g., 300 to 700 degrees Celsius, more specifically, 350 to 650 degrees Celsius. Since the $NH_3$ gas requiring a high temperature for reaction fails to react under the temperature of the wafer as described above, the pressure in the processing chamber 201 is set to be a relatively high pressure so that the $NH_3$ gas can be thermally activated. Further, it is possible to induce a soft reaction by thermally activating and supplying the $NH_3$ gas, which makes the above-mentioned modification process softly.

Gas flowing inside the processing chamber 201 is the $NH_3$ gas, but dos not flow outside the processing chamber 201. Because of this, the $NH_3$ gas reacts a portion of the silicon-containing layer (used as a first layer) formed on the wafer 200 at the step 1 (S4d) without a vapor phase reaction. Then, the first layer is subjected to nitridation treatment so that it is modified to a second layer containing a silicon (i.e., a first element) and a nitrogen (i.e., a second element), i.e., a silicon nitride layer (SiN layer).

At this time, the nitridation reaction of the first layer should not nitridize the entire region of the silicon layer. For example, when the silicon layer made of several atomic layers is formed at the step 1 (S4d), a portion of the surface layer (i.e., an uppermost atomic layer) of the silicon layer is nitridized. Specifically, a portion or whole of a region nitridable of the surface layer (e.g., a region at which the silicon is exposed) is nitridized. In this case, the nitridation is performed under the condition that the nitridation reaction of the first layer is not saturated, so that the whole of the first layer is not subjected to nitridation. In some embodiments, according to conditions, although a plurality of layers (e.g., including several underlying layers starting from the surface layer) of the first layer may be nitridized, only the surface layer is nitridized, which improves a controllability of composition ratio associated with the silicon nitride film.

Subsequently, the valves vb1 to vb3 of the reaction gas supply pipe 213b are closed to stop the supply of the HCD gas. At this time, while the APC valve 262 of the exhaust pipe 261 is opened, the interior of the processing chamber 201 is vacuum-exhausted by the vacuum pump 264 such that unreacted HCD gas or the HCD gas remaining after being used in the formation of the silicon-containing layer, which is retained within the processing chamber 201, is discharged from the processing chamber 201.

As the nitride-containing gas, for example, $N_2$ gas, $NF_3$ gas, $N_3H_8$ gas or the like may be employed in addition to the $NH_3$ gas.

[Cycle Repetition Step (S4f)]

As described above, the step 1 (S4d) and the step 2 (S4e) constituting one cycle are repeatedly performed one or more times, so that a thin film having a predetermined thickness, which is formed by the silicon (i.e., the first element) and the nitrogen (i.e., the second element), i.e., the silicon nitride film (i.e., SiN film), can be formed. Further, the above-described cycle may be repeatedly plural times.

[Purge Step (S4g)]

Upon completion of a film formation process of forming the silicon nitride film having the predetermined thickness, the inert gas such as $N_2$ or the like is supplied into the processing chamber 201, followed by being exhausted from the exhaust pipe 261 through the exhaust duct 259 and the exhaust outlet 260, so that the interior of the processing chamber 201 is purged with the inert gas (in the purge process). Subsequently, the atmosphere within the processing chamber 201 is displaced by the inert gas (in an inert gas displacement process).

[Gate Valve Opening Step (S4h) & Wafer Carrying-Out Step (S4i)]

The elevation mechanism 207b is operated so that the susceptor 217 is lowered to the wafer transferring position as shown in FIG. 4 to mount the wafer 200 on the lift pins 208b. Subsequently, the gate valve 251 is opened to transfer the wafer 200 out of the processing chamber 201.

[Cleaning Step (S5)]

If the thin film formation step (S4) as described above is repeatedly performed, the SiN film is deposited on members provided in the processing chamber 201, for example, the internal wall of the process vessel 202, the shower plate 240b, the susceptor 217, the conductance plate 204 or the like. Specifically, SiN-containing deposits are adhered and accumulated onto the internal wall of the process vessel 202. At a point where a thickness of the deposits accumulated onto the internal wall of the process vessel 202 reaches a predetermined thickness from which abrasion or dropping of the deposits occurs, a cleaning process is performed on the interior of the processing chamber 201. In some embodiments, the cleaning process is performed by supplying only $ClF_3$ gas (used as a cleaning gas) or the $ClF_3$ gas diluted with the inert gas into the processing chamber 201 heated to a predetermined temperature, and removing the deposits deposited (or accumulated) inside the processing chamber 201. The following is a detailed description of the cleaning step (S5).

[Gate Valve Closing Step (S5a)]

In a state where the wafer 200 is not loaded into the processing chamber 201, i.e., the top surface of the susceptor 217 is exposed because the wafer 200 is not placed on the support stage 203, the gate valve 251 is closed. In this situation, by operating the elevation mechanism 207b, the susceptor 217 is lifted up to the wafer process position as shown in FIG. 3.

[Pressure Regulating & Temperature Controlling Step S5b]

Subsequently, the interior of the processing chamber 201 is vacuum-exhausted by means of the vacuum pump 264 so that a pressure therein is maintained at a predetermined pressure (or a vacuum degree). The pressure within the processing chamber 201 is measured by a pressure sensor (not shown). The APC valve 262 is feedback-controlled based on the measured pressure data (in a pressure regulating process). Further, the processing chamber 201 is heated by the heater 206 so that the interior thereof is maintained at a predetermined temperature. At this time, the amount of the current supplied to the heater 206 is feedback-controlled based on temperature data detected by a temperature sensor (not shown), thereby ensuring that the processing chamber 201 has a predetermined temperature (or a cleaning temperature) (in a temperature controlling process).

[ClF3 Gas Supply Step (S5c)]

Subsequently, in a state that the temperature and pressure within the processing chamber 201 are maintained at a predetermined temperature and pressure, respectively, the valves ve1 to ve3 of the cleaning gas supply pipe 213e are opened so that $ClF_3$ gas flows through the cleaning gas supply pipe 213e. A flow rate of the $ClF_3$ gas flowing into the cleaning gas supply pipe 213e is regulated by the MFC 222e. The regulated $ClF_3$ gas flows through the cleaning gas supply pipe 213e, followed by being distributing by the shower head 240, so that it is supplied into the surface of the susceptor 217 or the internal wall of the processing chamber 201. Subsequently, the $ClF_3$ gas flows through the exhaust duct 259 so that it is exhausted from the exhaust pipe 261 through the exhaust outlet 260.

Simultaneously, the valves vf1 to vf3 and vg1 to vg3 are opened to flow the inert gas such as $N_2$ gas and the like into the inert gas supply pipes 213f and 213g, so that the $ClF_3$ gas used as the cleaning gas may be diluted with the $N_2$ gas. A flow rate of the $N_2$ gas flowing into the inert gas supply pipes 213f and 213g is regulated by the respective MFCs 222f and 222g. The regulated $N_2$ gas is supplied, together with the cleaning gas, into the processing chamber 201. Thereafter, the regulated $N_2$ gas flows through the exhaust duct 259, followed by being exhausted from the exhaust pipe 261 through the exhaust outlet 260. Controlling the supply flow rate of the $N_2$ gas makes it possible to control a concentration of the $ClF_3$ gas.

The $ClF_3$ gas or the diluted $N_2$ gas, introduced into the processing chamber 201, is in contact with the deposits containing a thin film formed of SiN or the like, which accumulate onto the internal wall of the processing chamber 201 and the surface of the susceptor 217 while passing through the interior of the processing chamber 201. At this time, a thermo-chemical reaction occurs so that the deposits are removed. Specifically, the deposits are removed by an etching reaction between an activated species generated by a thermal decomposition of the $ClF_3$ gas and the deposits.

Further, as described above, the SiC film is coated on the surface of the carbon base material or the Si-impregnated SiC base material constituting the susceptor 217 through the CVD. The SiO film is formed on the uppermost surface of the SiC film. The SiO film is formed by repeatedly performing steps of forming the silicon-containing layer on the SiC film by using the HCD gas, and oxidizing the silicon-containing layer by using the $O_2$ gas and the $H_2$ gas under an atmosphere having pressure below atmospheric pressure. The SiO film formed by this step has a high etching resistance in comparison with the SiO film formed on the surface of the SiC film by a CVD process. This makes it possible to prevent the SiO film from being etched when the deposits are removed with the $ClF_3$ gas. Further, this makes it possible to prevent the CVD-SiC film underlying the SiO film from being etched, thereby avoiding contamination of the wafer 200 or the interior of processing chamber 201, which may be induced by exposure of the carbon base material or the Si-impregnated SiC base material underlying the CVD-SiC film.

[Purging Step (S5d)]

When a predetermined etching time for the deposits has elapsed and when the cleaning process for the processing chamber 201 has ended, the valves ve1 to ve3 are closed to stop the supply of the $ClF_3$ gas or the diluted $ClF_3$ gas into the processing chamber 201. Subsequently, the $N_2$ gas is supplied into the processing chamber 201, followed by flowing through the exhaust duct 259, and further followed by being exhausted from the exhaust pipe 261 through the exhaust outlet 260. Thus, the interior of the processing chamber 201 is purged.

Further, as an example, an etching condition on the deposits in the cleaning step S5 is as follows.

Temperature within processing chamber: 350 to 500 degrees Celsius

Pressure within processing chamber: 6,650 Pa (50 Torr) to 26,600 Pa (200 Torr), more specifically, 13,300 Pa (100 Torr) to 19,950 Pa (150 Torr)

Supply flow rate of $ClF_3$ gas: 0.5 to 5 slm

Supply flow rate of $N_2$ gas: 1 to 20 slm

In a certain embodiment, the film etching process may be performed based on constant values selected in the respective ranges according to the etching condition.

As the cleaning gas, a fluorine-containing gas such as $NF_3$ gas, HF gas, $F_2$ gas or the like may be employed in addition to the $ClF_3$ gas.

<Reformation Step (S6) of SiO Film on Surface of Susceptor>

When the cleaning step (S5) as described above is performed, the deposits containing the thin film formed of SiN may be etched and hence the SiO film formed at the SiO film formation step (S1) may be slightly etched. The reason for this is that, for example, a thickness of the deposits adhered onto the surface of the susceptor 217 is non-uniform over the entire surface thereof. Specifically, in the deposits, a thin deposition portion is first etched so that the SiO film thereunder is exposed during the cleaning process, thereby being exposed to the $ClF_3$ gas for a long period of time. Further, when etching rates on the deposits varies by site, a portion having a high etching rate is first etched so that the SiO film thereunder is exposed during the cleaning process, thereby being exposed to the $ClF_3$ gas for a long period of time. To address this, after the cleaning step (S5), the SiO film forming step (S1) and the modification step (S2) are again performed prior to the pre-coating step (S3) and the thin film forming step (S4). Thus, the SiO film is recovered so that the etching resistance effect of the CVD-SiC film based on the SiO film can be stably kept. As a result, it is possible to reliably prevent the CVD-SiC film formed on the surface of the carbon base material or the Si-impregnated SiC base material from being etched.

Further, the cleaning step (S5) is then followed by the SiO film forming step (S1) and the modification step (S2) so that a cleaning residue such as a remaining fluorine (F) inside the processing chamber 201 after the cleaning can be effectively removed.

Specifically, in the course of again performing the SiO film forming step (S1) and the modification step (S2) after the cleaning step (S5), when the $O_2$ gas and the $H_2$ gas are supplied into the processing chamber 201 under a reduced-pressure atmosphere (in the steps S1e and S2b), the $H_2$ gas supplied into the processing chamber 201 reacts with the remaining fluorine (F) to produce HF gas (i.e., the fluorine is consumed), the remaining fluorine (F) is displaced by the $O_2$ gas supplied into the processing chamber 201, and the remaining fluorine (F) is displaced by a reaction species containing O (i.e., an atomic oxygen) which is produced by reaction between the $O_2$ gas and the $H_2$ gas supplied into the processing chamber 201. Thus, the cleaning residue such as the remaining fluorine (F) inside the processing chamber 201 after the cleaning can be effectively removed. Further, the reaction species containing O (i.e., an atomic oxygen) is drastically contributed to remove the cleaning residue such as the remaining fluorine (F).

Further, the SiO film reformation step (S6) may be performed for every cleaning in order to obtain the recovering effect of the SiO film and the removal effect of the cleaning residue. In other words, the cleaning step and the SiO film reformation step may be performed as one set.

Further, after the SiO film forming step (S1) and the modification step (S2) are again performed, the pre-coating step (S3) of coating the internal wall of the processing chamber 201 with the same film as the thin film formed at the thin film forming step (S4), i.e., the SiN film, is performed before the thin film forming step (S4) is again performed. At this time, in other embodiment, a SiON film, whose composition ratio gradually changes from SiO to SiN, may be formed on the SiO film.

Further, in some embodiments, in case that the SiON film, whose composition ratio gradually changes from SiO to SiN, is formed on the SiO film, a HCD gas supply step (S3b), a $NH_3$ gas supply step (S3c) and a $O_2$ gas supply step, which constitute one cycle, are performed predetermined times. Simultaneously, pressure in the processing chamber 201 and a gas supply time in predetermined respective steps may be varied.

For example, in the $O_2$ gas supply step, pressure (e.g., $O_2$ gas partial-pressure) within the processing chamber 201 is initially set to be high, and then is gradually decreased for each cycle. Alternatively, an $O_2$ gas supply time is initially set to be long and then is gradually shortened. By doing so, it is possible to form a SiON film on the SiO film, the SiON film having a composition ratio gradually changing from SiO to SiN. Further, in the SiON film formed on the SiO film, the concentration of oxygen is higher at a location closer to an interface between the SiON film and the SiO film, and is lower at a location closer to the surface of the SiON film.

Further, in one embodiment, after the formation of the SiON film, the HCD gas supply step (S3b) and the $NH_3$ gas supply step (S3c) being set as one cycle operation may be repeatedly performed predetermined times so that the SiN film is formed on the SiON film. Thus, a layered film of the SiO film, the SiON film having a composition ratio gradually changing from SiO to SiN, and the SiN film, i.e., SiN film/SiON film/SiO film, is formed. Further, in the SiON film formed between the SiO film and the SiN film, the concentration of oxygen is higher at a location closer to an interface between the SiON film and the SiO film, and is lower at a location closer to an interface between the SiON film and the SiN film.

A condition for which the SiON film is formed may be similar to the above-mentioned pre-coating step (S3) (or the thin film forming step (S4)) except for the $O_2$ gas supply step. In some embodiments, pressure within the processing chamber 201 in the $O_2$ gas supply step may be maintained in the range of, e.g., 10 to 5,000 Pa. A supply flow rate of the $O_2$ gas may be maintained in the range of e.g., 100 to 10,000 sccm. A time period during which the wafer 200 is exposed to the $O_2$ gas may be set to be in the range of e.g., 1 to 120 seconds. The temperature of the wafer 200 may be maintained at a temperature in the range of, e.g., 300 to 700 degrees Celsius, preferably, 350 to 650 degrees Celsius, similarly to the HCD and $NH_3$ gas supply steps.

As described above, the SiON film having the composition ratio gradually changing from SiO to SiN, or the layered film of the SiON film and the SiN film (i.e., SiN film/SiON film) is formed on the SiO film. Further, the thin film forming step (S4) is repeatedly performed. This decreases (or alleviates) stress, which might be applied to the SiN film deposited on the SiON film or the SiN film/SiON film. Therefore, it is possible to prevent the SiN film from cracking or peeling off, thereby avoiding the generation of particles inside the processing chamber 201.

(3) Effects of Embodiments

The embodiments as described above may have one or more of the following effects:

(a) According to the embodiments of the present disclosure, the SiC film is coated on the surface of the carbon base material or the Si-impregnated SiC base material that implements the susceptor 217 by a CVD process. Further, the SiO film is formed on the outermost surface of the SiC film. As described in the SiO film forming step (S1), the SiO film is formed by repeatedly performing steps of forming the silicon-containing layer on the SiC film by using the HCD gas, and oxidizing the silicon-containing layer by using the $O_2$ gas and the $H_2$ gas under an atmosphere having pressure below atmospheric pressure.

The SiO film formed by the above procedure has a high etching resistance in comparison with the SiO film formed on the surface of the SiC film by a CVD process. In other words, according to the step S1, it is possible to form a SiO film having a high etching resistance, i.e., a low etching rate when performing the cleaning process, compared with the case of forming the SiO film on the SiC film through CVD by using a raw material such as the TEOS gas and the like, or such as DCS gas and $N_2O$ gas.

Accordingly, it is possible to prevent the SiO film from being etched when performing the cleaning step (S5). Further, this makes it possible to prevent the CVD-SiC film underlying the SiO film from being etched (or decrease in thickness of film), thereby avoiding contamination of the wafer 200 or the interior of processing chamber 201, which may be induced by exposure of the carbon base material or the Si-impregnated SiC base material underlying the CVD-SiC film.

(b) According to the step S1, the concentration of impurities contained inside the SiO film can be reduced in comparison with the formation of the SiO film on the surface of the SiC film through the CVD process or the thermal oxidation process.

For example, in case that the SiO film is formed on the SiC film through the CVD process by using a raw material such as the TEOS gas and the like, impurities such as carbon (C) or the like contained in TEOS may be adulterated in the SiO film being formed. Also, in case that the surface of the SiC film is oxidized to form the SiO film through the thermal oxidation process by using the $O_2$ gas and the like, metal contamination materials such as iron (Fe), nickel (Ni), and the like may be adulterated in the SiO film being formed. In case that the wafer 200 is supported by the susceptor 217 having such a SiO film formed on the surface of a SiC film, for example, if the SiN film is formed on the surface of the wafer 200, impurities contained in the SiO film may be externally diffused during the formation of the SiN film, followed by flowing into the SiN film, which causes contamination of the SiN film.

On the other hand, according to the step S1, since the SiO film is formed by repeatedly performing a sequence of forming the silicon-containing later on the SiC film by using the HCD gas, and oxidation-processing the silicon-containing layer by using the $O_2$ gas the $H_2$ gas under an atmosphere having pressure below atmospheric pressure, and the SiC film is not oxidized, it is possible to decrease the concentration of impurities contained in the film.

(c) Further, according to the step S1, the SiO film can be formed at a lower temperature compared to the case of forming the SiO film on the surface of the SiC film through the CVD process or thermal oxidation.

(d) According to the modification step (S2), the modification process is additionally performed on the SiO film formed at the SiO film forming step (S1) by using the $O_2$ gas the $H_2$ gas under an atmosphere having pressure below atmospheric pressure. This enables the formation of the SiO film having a high etching resistance.

(e) According to the modification step (S2), the modification process is additionally performed on the SiO film formed at the SiO film forming step (S1) by using the $O_2$ gas the $H_2$ gas under an atmosphere having pressure below atmospheric pressure. Through the modification process, it is possible to further decrease the concentration of impurities contained in the SiO film. In other words, by adding the $H_2$ gas to the $O_2$ gas under a reduced-pressure atmosphere, the removal effect of in-film impurity can be dramatically increased in comparison with the $O_2$ annealing and the $N_2$ annealing process.

(f) According to the above embodiments, after the cleaning step (S5), the SiO film forming step (S1) and the modification step (S2) are again performed prior to the pre-coating step (S3) and the thin film forming step (S4). Thus, the SiO film is recovered so that the etching resistance effect of the CVD-SiC film based on the SiO film can be stably kept. As a result, it prevents the CVD-SiC film formed on the surface of the carbon base material or the Si-impregnated SiC base material from being etched.

(g) Further, the cleaning step (S5) is then followed by the SiO film forming step (S1) and the modification step (S2). As a result, a cleaning residue such as a remaining fluorine (F) inside the processing chamber 201 after the cleaning can be effectively removed.

(h) According to the above embodiments, the SiO film forming step (S1), the modification step (S2) and the pre-coating step (S3) can be continuously performed inside the same process vessel 202. This improves throughput of the substrate process.

The following is a description of Examples 1 and 2.

Example 1

FIG. 8 is a table showing comparative results of measured dry etching rates (D.E.R) for SiN, SiC, and Quartz by $ClF_3$ gas under a relatively low pressure condition.

In the measurement as shown in FIG. 8, chips of SiN, SiC, Quartz are prepared as estimation samples, and an etching process is performed on each of the chips by using the $ClF_3$ gas. The etching conditions may be as follows: a temperature (or cleaning temperature) of the estimation sample is 400 degrees Celsius, a pressure within the processing chamber is 865 Pa (6.5 Torr), a $ClF_3$ gas flow rate is 0.2 slm, and a $N_2$ gas flow rate is 0.8 slm.

From FIG. 8, it is found that the Quartz has a lowest dry etching rate, and dry etching rates of the SiC, the SiN and the Si is increased in that order (i.e., Quartz<SiC<SiN<Si). That is to say, it is found that in these materials, the Quartz material is the hardest to etch. Therefore, a plate member (or cover member) made of Quartz is formed to cover the CVD-SiC film formed on the carbon base material or the Si-impregnated SiC base material, which restrains etching of the CVD-SiC film. Unfortunately, it is difficult to precisely work a plate member made of Quartz to meet a surface shape of a susceptor having a complicated configuration without generating a gap, or to work the plate member in a thin thickness in order to ensure a thermal conductivity. For this reason, as described in the above embodiments, provided is a practical and effective approach that forms the SiO film to protect the CVD-SiC film, without using the plate member made of Quartz.

Example 2

FIG. 9 is a table showing comparative results of measured dry etching rates (D.E.R) for various kinds of silicon oxide materials which may be used for the protection of the CVD-SiC film, and SiN, by $ClF_3$ gas.

In the measurement as shown in FIG. 9, chips of Quartz, Thermal-SiO, CVD-SiO, New-SiO (1), New-SiO (2), and SiN are prepared as estimation samples, and an etching process is performed on each of the chips by using the $ClF_3$ gas. The etching conditions may be as follows: a temperature (or cleaning temperature) of the estimation sample is 400 degrees Celsius, a pressure within the processing chamber is 13,300 Pa (100 Torr), a $ClF_3$ gas flow rate is 1 slm, and a $N_2$ gas flow rate is 9 slm.

The Thermal-SiO is a sample made of a SiO film that is formed by a thermal oxidation under a high temperature oxygen atmosphere. The formation conditions of the Thermal-SiO may be as follows: a temperature within the processing chamber (or processing temperature) is 1,000 degrees Celsius, a pressure (or processing pressure) within the processing chamber is an atmosphere pressure, an atmosphere is set to oxygen ($O_2$) gas 100%, and a film thickness is about 1,000 Å.

The CVD-SiO is a sample made of a SiO film that is formed by a CVD process with DCS and $N_2O$ gases. The formation conditions of the CVD-SiO may be as follows: a temperature within the processing chamber (or processing temperature) is 780 degrees Celsius, a pressure (or processing pressure) within the processing chamber is 50 Pa (0.38 Torr), a DCS gas flow rate is 100 sccm, a $N_2O$ gas flow rate is 200 sccm, and a film thickness is about 6,000 Å.

The New-SiO (1) is a sample made of a SiO film that is formed by repeatedly performing the steps of forming the silicon-containing layer by using the HCD gas, and oxidizing the silicon-containing layer by using the $O_2$ and $H_2$ gases under pressure below atmospheric pressure as described above. The formation conditions of the New-SiO (1) may be as follows: a temperature within the processing chamber (or processing temperature) is 600 degrees Celsius, a HCD gas flow rate is 0.2 slm, a pressure (or processing pressure) within the processing chamber during the HCD gas supply is 399 Pa (3 Torr), a $O_2$ gas flow rate is 2.0 slm, a $H_2$ gas flow rate is 1.8 slm, a pressure (or processing pressure) within the processing chamber during the $O_2$ and $H_2$ gas supply is 1 to 100 Pa (0.008 to 0.75 Torr), and a film thickness is about 1700 Å.

The New-SiO (2) is a sample made of a SiO film resulting from further performing the modification process on the New-SiO (1) using the $O_2$ and the $H_2$ gases under an atmosphere having pressure below atmospheric pressure. The formation conditions of the New-SiO (2) are similar to the formation conditions of the New-SiO (1) during the $O_2$ and $H_2$ gas supply.

The SiN is a sample made of a SiO film that is formed by the CVD process with DCS and $NH_3$ gases. The formation conditions of the SiN may be as follows: a temperature within the processing chamber (or processing temperature) is 760 degrees Celsius, a pressure (or processing pressure) within the processing chamber is 10 to 500 Pa, a DCS gas flow rate is 100 to 500 sccm, a $NH_3$ gas flow rate is 500 to 5,000 sccm, and a film thickness is set to be thicker than the above-described samples.

From FIG. 9, it is found that the Quartz has a lowest dry etching rate, and dry etching rates of the Thermal-SiO, the New-SiO (2), the New-SiO (1), the CVD-SiO and the SiN is increased in that order. That is to say, it is found that among these materials, the Quartz material is the hardest to etch. Unfortunately, as described above, it is difficult to precisely work a plate member made of Quartz to meet a surface shape of a susceptor having a complicated configuration without generating a gap, or to work the plate member in a thin thickness in order to ensure a thermal conductivity.

In addition, it is found that, as shown in FIG. 9, the dry etching rate of the Thermal-SiO is relatively low so that it is hard to etch. The Thermal-SiO film is formed by oxidizing the CVD-SiO film formed on the surface of the susceptor under a dry atmosphere (i.e., $O_2$ gas atmosphere) or a wet atmosphere (i.e., $H_2O$ atmosphere). Unfortunately, such an approach may involve an oxidization of the CVD-SiC film itself or a decrease in thickness of the CVD-SiC film. To boot, since the CVD-SiC film has a relatively thin thickness, if the oxidization process is repeatedly performed, a thickness of the CVD-SiC film may be decreased or dissipated. As a result, a contamination prevention effect due to the CVD-SiC film lowers, resulting in encouraging contamination induced by the carbon base material or the Si-impregnated SiC base material underlying the CVD-SiC film. Further, the oxidization of the surface of the CVD-SiC film requires that the CVD-SiC film is heated at a high temperature of 1,000° C. or more, which may prolong the time required for forming the SiO film having a predetermined thickness. For example, the time of 20 hours or more is required to form SiO film having a thickness of 3,000 Å by thermal-oxidizing the CVD-SiC film under $O_2$ gas atmosphere of 1,200° C. Further, as described above, in case that the SiO film is formed by thermal-oxidizing the surface of the CVD-SiC film, metal contamination materials such as iron (Fe), nickel (Ni), and the like (i.e., impurities contained in the SiC film) may be adulterated in the SiO film being formed.

From the viewpoint of the above, the CVD-SiO film, the New-SiO (1) or the New-SiO (2) are useful as the silicon oxide that may be used for the protection of the CVD-SiC film. Specifically, even though the New-SiO (1) or the New-SiO (2) are formed at a temperature lower than that required for forming the CVD-SiO, they are preferable in view of a lower dry etching rate (i.e., a high etching resistance) with respect to the CVD-SiO. Likewise, even though the New-SiO (1) or the New-SiO (2) are formed at a temperature lower than that required for forming the CVD-SiO, they are preferable in view of a lower in-film impurity concentration with respect to the CVD-SiO.

Further, it is found that, as shown in FIG. 9, the etching resistance of the New-SiO (2) is higher than that of the New-SiO (1), while an in-film impurity concentration of the New-SiO (2) is lower than that of the New-SiO (1). Specifically, it is found that, the modification process for the New-SiO (2) increases an etching resistance of the New-SiO (1) and decreases in-film impurity concentration of the New-SiO (1). Further, it is found that the modification for the New-SiO (2) is performed at a temperature higher than that required for forming the New-SiO (1) so that the etching resistance can be further increased, and the in-film impurity concentration can be further decreased.

Further, as shown in FIG. 9, an etching selectivity of the SiN to the New-SiO (1) (i.e., SiN/New-SiO (1)) is about 2.5, and an etching selectivity of the SiN to the New-SiO (2) (i.e., SiN/New-SiO (2)) is about 2.6. In an alternate estimation, it is found that, through adjustment of the cleaning conditions, both the etching selectivities (SiN/New-SiO (1) and (SiN/New-SiO (2)) may be set to be 2.5 to 20 or more.

Another Embodiments

In the foregoing embodiments, while a single wafer type equipment which processes a single wafer at a time has been explained as one example of the substrate processing apparatus, the present disclosure is not limited thereto. For example, the present disclosure is also applicable to other types of substrate processing apparatus, including a vertical-type equipment of a batch-type which processes a plurality of wafers at a time.

Figure 10A:
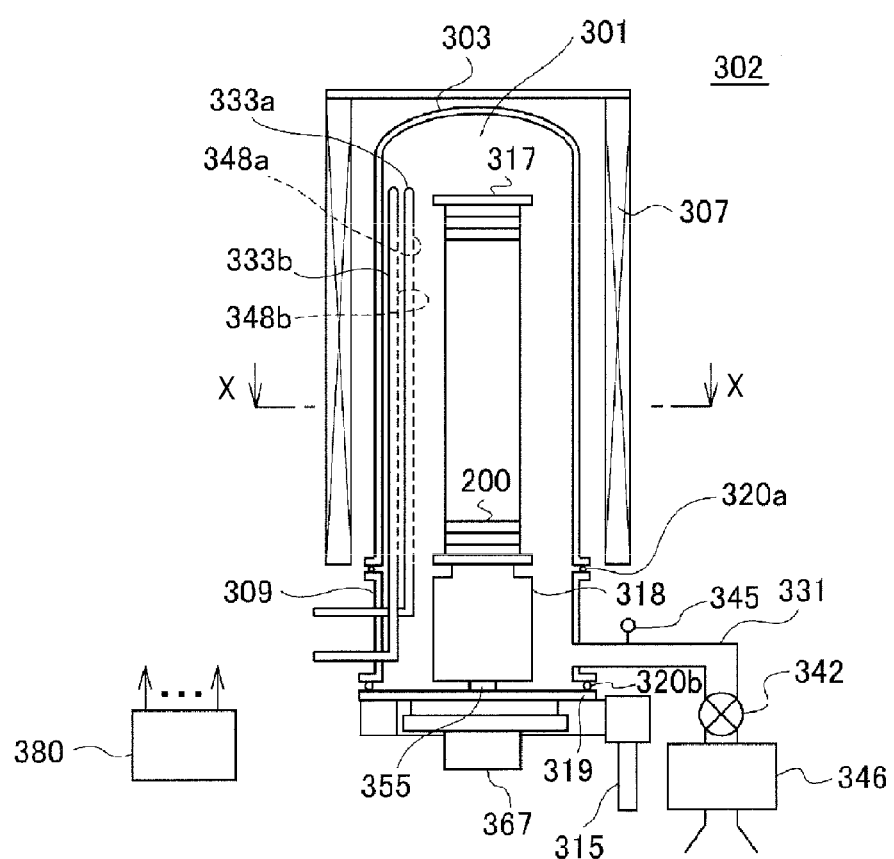
FIG. 10A shows a longitudinal sectional view of a vertical-type process furnace provided in a vertical-type processing apparatus in accordance with another embodiment of the present disclosure.
Figure 10B:
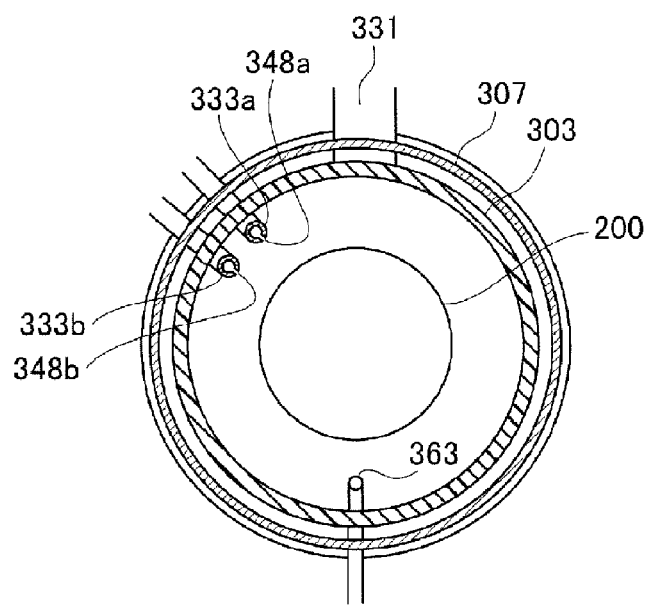
FIG. 10B shows a cross-sectional view taken along a line X-X in FIG. 10A.

FIGS. 10A and 10B show a longitudinal sectional view of a vertical-type process furnace provided in a vertical-type processing apparatus which may be preferably employed in another embodiment of the present disclosure, respectively. FIG. 10A is a longitudinal sectional view of a processing furnace 302 and FIG. 10B is a cross-sectional view taken along a line A-A in FIG. 10A.

As shown in FIG. 10A, the processing furnace 302 includes a heater 307 used as a heating part (or heating mechanism). The heater 307 is formed in a circular shape and is vertically disposed by being supported by a heater base (used as a support plate).

Inside the heater 307, a process tube 303 (used as a reaction tube) concentrically formed with the heater 307 is disposed. The process tube 303 is made of a heat-resistant material such as quartz ($SiO_2$) or silicon carbide (SiC), and is formed in a tubular shape that is closed at the upper end and open at the lower end. A processing chamber 301 is defined by the tubular hollow space inside the process tube 303, and is configured to hold the wafers 200 (used as substrates) to be vertically stacked and concentrically aligned by means of a boat 317 (which will be described later).

Beneath a process tube 303, a manifold 309 is disposed concentrically with the process tube 303. The manifold 309 may be made of, for example, stainless steel or the like, and may be formed in a tubular shape that is open at upper and lower ends. The manifold 309 is engaged with the lower end of the process tube 303 to support the process tube 303. An O-ring 320a (used as a sealing member) is disposed between the manifold 309 and the process tube 303. The manifold 309 is supported by a heater base so that the process tube 303 is vertically mounted. The process tube 303 and the manifold 309 define a reaction vessel.

A first nozzle 333a (used as a first gas introduction part) and a second nozzle 333b (used as a second gas introduction part) are connected to the manifold 309 while passing through the side wall of the manifold 309. The first and second nozzles 333a and 333b are formed in an L-like shape having a horizontal portion and a vertical portion, respectively. The horizontal portion is connected to the manifold 309, and the vertical portion is disposed in a ring-shaped space defined between the internal wall of the process tube 303 and the wafers 200. In the ring-shaped space, the vertical portion is disposed along the internal wall of the process tube 303 starting from its lower portion to its upper portion in the direction of stacking the wafers 200. First and second gas supply holes 348a and 348b (used as supply holes) through which gas is supplied are respectively formed on the side surface of the vertical portion of the first and second nozzles 333a and 333b. Each of the first and second gas supply holes 348a and 348b (e.g., of an elongated shape) has the same opening area from its lower portion to its upper portion, and are also formed in the same opening gap.

A gas supply system, which is connected to the first and second nozzles 333a and 333b, is similar to the above-described embodiments except that a raw material gas supply system, a cleaning gas supply system and a first inert gas supply system are connected to the first nozzle 333a, and a reaction gas supply system, an oxygen-containing gas supply system, a hydrogen-containing gas supply system and a second inert gas supply system are connected to the second nozzle 333b. That is to say, in this embodiment, the raw material and the reaction gas are supplied through different nozzles.

An exhaust pipe 331 configured to exhaust atmosphere within the processing chamber 301 is disposed in the manifold 309. A vacuum pump 346 (used as a vacuum exhaust device) is connected to the exhaust pipe 331 through a pressure sensor 345 (used as a pressure detector) and an APC (Automatic Pressure Controller) valve 342 (used as a pressure regulator). The APC valve 342 is adjusted based on pressure information detected by the pressure sensor 345 so that the inside of the processing chamber 201 is exhausted so as to maintain a pressure in the processing chamber 301 at a desired pressure (i.e., at a desired vacuum degree). Further, the APC valve 342 is configured to be opened and closed so as to perform or block the exhaustion of the processing chamber 301, and is further configured to regulate an opening degree thereof so as to maintain the pressure in the processing chamber 301 at a desired pressure.

A seal cap 319 (used as a furnace opening lid) for airtightly sealing the lower end opening of the manifold 309 is provided at the lower side of the manifold 309. The seal cap 319 is configured to abut against the lower end of the manifold 309 upward in a vertical direction. The seal cap 319 is made of metal, e.g., stainless steel, and is formed in a disc-like shape. An O-ring 320b (used as a seal member) for making contact with the lower end of the manifold 309 is provided on the upper surface of the seal cap 319. A rotation mechanism 367 for rotating the boat 317 (which will be described later) is provided at an opposite side of the seal cap 319 to the processing chamber 301. The rotation mechanism 367 includes a rotation shaft 355 extending through the seal cap 319 and connected to the boat 317. The rotation mechanism 367 is configured to rotate the wafers 200 by rotating the boat 317. The seal cap 319 is configured to be vertically moved by a boat elevator 315 (used as a lift mechanism) vertically provided outside the process tube 303. This makes it possible to load and unload the boat 317 into and from the processing chamber 301.

The boat 317 serving as a substrate holder is configured to hold a plurality of wafers 200, each being laid on its circular side, with the centers thereof aligned with each other. The boat 317 is implemented by coating a SiC film on the surface made of a carbon base material or the Si-impregnated SiC base material which is shape-processed in advance, followed by forming a SiO film on the outermost surface of the SiC film. An approach of forming the SiO film is similar to the above-described embodiments.

A heat-insulating member 318 made of a heat-resistant material, e.g., quartz or silicon carbide, is provided below the boat 317 (and above the seal cap 319). The heat-insulating member 318 is configured to make it difficult for the heat generated by the heater 307 to be transferred to the seal cap 319. A temperature sensor 363 (used as a temperature detector) is arranged within the process tube 303. By controlling the power supply to the heater 307 based on the temperature information detected by the temperature sensor 363, the internal temperature of the processing chamber 301 is controlled to have a desired temperature distribution. Similar to the first and second nozzles 333a and 333b, the temperature sensor 363 is provided along the inner wall of the process tube 303.

A controller 380 (used as a control unit or control means) is configured to control the operations of the APC valve 342; the heater 307; the temperature sensor 363; the vacuum pump 346; the rotation mechanism 367; the boat elevator 315, the valves va1 to va3, vb1 to vb3, vc1 to vc3, vd1 to vd3, ve1 to ve3, vf1 to vf3, vg1 to vg3; and the mass flow controllers 222*a* to 222*g*.

Through the use of the vertical-type equipment, the SiO film forming step (S1), the modification step (S2), the pre-coating step (S3), and the thin film forming step (S4) according to the above embodiments are sequentially performed in that order. Further, after the thickness of deposits reaches a predetermined thickness by repeatedly performing the thin film forming step (S4), the cleaning step (S5) according to the above embodiment is performed. Upon completion of the cleaning step (S5), the SiO film forming step (S1), the modification step (S2) and the pre-coating step (S3) are again performed, and then, the thin film forming step (S4) is resumed.

Use of the vertical-type equipment as described above provides the same effects as the above embodiments. The raw material and reaction gases are supplied through different nozzles so that a film formation reaction in the nozzles is prevented, thus avoiding blocking of the nozzles or the generation of foreign substances in the nozzles.

Still Another Embodiment

While in the above embodiments the SiN film has been explained to be formed by the thin film forming step (S4), the present disclosure is not limited thereto. For example, the present disclosure is preferably applicable to cases of forming a silicon-based thin film other than the SiO film, such as SiON film, SiCN film, SiOCN film, SiOC film, Poly-Silicon film and the like, or forming a metal-based thin film.

The present disclosure is not limited to the detailed explanations of the embodiments described above but may be modified in various ways without departing from the gist of the present disclosure.

<Aspects of Present Disclosure>

Hereinafter, the preferred aspects of the present disclosure will be additionally stated.

One aspect of the present disclosure provides a method of manufacturing a semiconductor device. The method includes: forming, in a state that a process vessel houses a substrate holder formed by coating a SiC film on a surface of a carbon base material or a Si-impregnated SiC base material through a CVD process, a silicon oxide film on the surface of the substrate holder by repeatedly performing supplying and exhausting a silicon-containing gas into and from the process vessel, to thereby form a silicon-containing layer on the surface of the substrate holder, and supplying and exhausting an oxygen-containing gas and a hydrogen-containing gas into and from the process vessel under an atmosphere having pressure below atmospheric pressure, to thereby change the silicon-containing layer into a silicon oxide layer; supplying and exhausting, in a state that a substrate is held by the substrate holder whose surface has the silicon oxide film formed thereon in the process vessel, a process gas into and from the process vessel, to thereby form a thin film other than the silicon oxide film on the substrate; supplying and exhausting, in a state that the substrate holder after repeatedly performing the thin film formation is housed in the process vessel, a fluorine-containing gas into and from the process vessel, to thereby remove deposits including the thin film attached onto the substrate holder; and reforming, in a state that the substrate holder after removal of the deposits is housed in the process vessel, a silicon oxide film on the surface of the substrate holder after removal of the deposits by repeatedly performing supplying and exhausting the silicon-containing gas into and from the process vessel, to thereby form the silicon-containing layer on the surface of the substrate holder after removal of the deposits, and supplying and exhausting the oxygen-containing gas and the hydrogen-containing gas into and from the process vessel under an atmosphere having pressure below atmospheric pressure, to thereby change the silicon-containing layer into a silicon oxide layer.

The method may further include, after forming the silicon oxide film, in a state that the substrate holder whose surface has the silicon oxide film formed thereon is housed in the process vessel, supplying and exhausting the oxygen-containing gas and the hydrogen-containing gas into and from the process vessel under an atmosphere having pressure below atmospheric pressure, to thereby modify the silicon oxide film.

The method may further include, after forming the silicon oxide film, in a state that the substrate holder whose surface has the silicon oxide film formed thereon is housed in the process vessel, supplying and exhausting the process gas into and from the process vessel, to thereby form the thin film on the silicon oxide film.

The method may further include, after modifying the silicon oxide film, in a state that the substrate holder whose surface has the modified silicon oxide film formed thereon is housed in the process vessel, supplying and exhausting the process gas into and from the process vessel, to thereby form the thin film on the modified silicon oxide film.

The method may further include, after reforming the silicon oxide film, in a state that the substrate holder whose surface has the silicon oxide film reformed thereon is housed in the process vessel, supplying and exhausting the oxygen-containing gas and the hydrogen-containing gas into and from the process vessel under an atmosphere having pressure below atmospheric pressure, to thereby modify the reformed silicon oxide film.

The method may further include, after reforming the silicon oxide film, in a state that the substrate holder whose surface has the silicon oxide film reformed thereon is housed in the process vessel, supplying and exhausting the process gas into and from the process vessel, to thereby form the thin film on the reformed silicon oxide film.

The method may further include, after modifying the reformed silicon oxide film, in a state that the substrate holder whose surface has the modified silicon oxide film reformed thereon is housed in the process vessel, supplying and exhausting the process gas into and from the process vessel, to thereby form the thin film on the modified reformed silicon oxide film.

Forming the silicon oxide film, removing the deposits, and reforming the silicon oxide film may be performed without the substrate supported by the substrate holder.

Modifying the silicon oxide film, forming the thin film on the silicon oxide film, forming the thin film on the modified silicon oxide film, modifying the reformed silicon oxide film, forming the thin film on the reformed silicon oxide film, and forming the thin film on the modified reformed silicon oxide film may be performed without the substrate supported by the substrate holder.

Another aspect of the present disclosure provides a substrate processing apparatus. The apparatus includes a process vessel configured to house a substrate therein for processing; a substrate holder configured to support the substrate in the process vessel, the substrate holder being formed by coating a SiC film on a surface of a carbon base material or a Si-impregnated SiC base material through a CVD process; a process gas supply system configured to supply a process gas into the process vessel; a silicon-containing gas supply system configured to supply a silicon-containing gas into the process vessel; an oxygen-containing gas supply system configured to supply an oxygen-containing gas into the process vessel; a hydrogen-containing gas supply system configured to supply a hydrogen-containing gas into the process vessel; a fluorine-containing gas supply system configured to supply a fluorine-containing gas into the process vessel; an exhaust system configured to exhaust an inside of the process vessel; and a controller configured to control the operations of the process gas supply system, the silicon-containing gas supply system, the oxygen-containing gas supply system, the hydrogen-containing gas supply system, the fluorine-containing gas supply system, and the exhaust system, so as to perform forming, in a state that the process vessel houses the substrate holder, a silicon oxide film on the surface of the substrate holder by repeatedly performing supplying and exhausting the silicon-containing gas into and from the process vessel, to thereby form a silicon-containing layer on the surface of the substrate holder, and supplying and exhausting the oxygen-containing gas and the hydrogen-containing gas into and from the process vessel under an atmosphere having pressure below atmospheric pressure, to thereby change the silicon-containing layer into a silicon oxide layer; supplying and exhausting, in a state that the substrate is held by the substrate holder whose surface has the silicon oxide film formed thereon in the process vessel, the process gas into and from the process vessel, to thereby form a thin film other than the silicon oxide film on the substrate; supplying and exhausting, in a state that the substrate holder after repeatedly performing the thin film formation is housed in the process vessel, a fluorine-containing gas into and from the process vessel, to thereby remove deposits including the thin film attached onto the substrate holder; and reforming, in a state that the substrate holder after removal of the deposits is housed in the process vessel, a silicon oxide film on the surface of the substrate holder after removal of the deposits by repeatedly performing supplying and exhausting the silicon-containing gas into and from the process vessel, to thereby form a silicon-containing layer on the surface of the substrate holder after removal of the deposits, and supplying and exhausting the oxygen-containing gas and the hydrogen-containing gas into and from the process vessel under an atmosphere having pressure below atmospheric pressure, to thereby change the silicon-containing layer into a silicon oxide layer.

Still another aspect of the present disclosure provides a substrate processing apparatus. The apparatus includes a process vessel configured to house a substrate therein for processing; a substrate holder configured to support the substrate in the process vessel, the substrate holder being formed by coating a SiC film on a surface of a carbon base material or a Si-impregnated SiC base material through a CVD process; a process gas supply system configured to supply a process gas including a silicon-containing gas into the process vessel; an oxygen-containing gas supply system configured to supply an oxygen-containing gas into the process vessel; a hydrogen-containing gas supply system configured to supply a hydrogen-containing gas into the process vessel; a cleaning gas supply system configured to supply a cleaning gas into the process vessel; and an exhaust system configured to exhaust an inside of the process vessel; and a controller configured to control the operations of the process gas supply system, the oxygen-containing gas supply system, the hydrogen-containing gas supply system, the cleaning gas supply system, and the exhaust system so as to perform forming, in a state that a substrate is not supported by the substrate holder, a silicon oxide film on the surface of the substrate holder by repeatedly performing supplying and exhausting the silicon-containing gas into and from the process vessel, to thereby form a silicon-containing layer on the surface of the substrate holder, and supplying and exhausting the oxygen-containing gas and the hydrogen-containing gas into and from the process vessel under an atmosphere having pressure below atmospheric pressure, to thereby oxidize the silicon-containing layer; processing, in a state that the substrate is supported by the substrate holder whose surface has the silicon oxide film formed thereon, the substrate by supplying and exhausting the process gas into and from the process vessel; removing, in a state that the processed substrate is not supported by the substrate holder, deposits attached on the substrate holder during the process of the substrate by supplying and exhausting the cleaning gas into and from the process vessel; and reforming, in a state that the substrate is not supported by the substrate holder, a silicon oxide film on the surface of the substrate holder by repeatedly performing supplying and exhausting the silicon-containing gas into and from the process vessel, to thereby form a silicon-containing layer on the surface of the substrate holder after removal of the deposits, and supplying and exhausting the oxygen-containing gas and the hydrogen-containing gas into and from the process vessel under an atmosphere having pressure below atmospheric pressure, to thereby oxidize the silicon-containing layer.

Still yet another aspect of the present disclosure provides a method of manufacturing a semiconductor device. The method includes: forming a silicon oxide film on a surface of a substrate holder (which is configured to support a substrate during process of the substrate) formed by coating a SiC film on a surface of a carbon base material or a Si-impregnated SiC base material through a CVD process, by repeatedly forming a silicon-containing layer on the SiC film by using a silicon-containing gas, and oxidizing the silicon-containing layer by using an oxygen-containing gas and a hydrogen-containing gas under an atmosphere having pressure below atmospheric pressure; processing, in a state that a substrate is held by the substrate holder whose surface has the silicon oxide film formed thereon, the substrate by using a process gas; removing deposits attached onto the substrate holder during the process of the substrate by using a cleaning gas; and reforming a silicon oxide film on the surface of the substrate holder by repeatedly performing forming a silicon-containing layer on the surface of the substrate holder after removal of the deposits by using the silicon-containing gas, and oxidizing the silicon-containing layer by using the oxygen-containing gas and the hydrogen-containing gas under an atmosphere having pressure below atmospheric pressure.

According to the present disclosure in some embodiments, it is possible to prevent a SiC film formed on a carbon base material or an Si-impregnated SiC base material from being etched, thereby avoiding contamination of the inside of the processing chamber or the surface of a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, the method comprising:

forming, in a state that a process vessel houses a substrate holder formed by coating a SiC film on a surface of a carbon base material or a Si-impregnated SiC base material through a CVD process, a silicon oxide film on the surface of the substrate holder by repeatedly performing supplying and exhausting a silicon-containing gas into and from the process vessel, to thereby form a silicon-containing layer on the surface of the substrate holder, and supplying and exhausting an oxygen-containing gas and a hydrogen-containing gas into and from the process vessel under an atmosphere having pressure below atmospheric pressure, to thereby change the silicon-containing layer into a silicon oxide layer;

supplying and exhausting, in a state that a substrate is held by the substrate holder whose surface has the silicon oxide film formed thereon in the process vessel, a process gas into and from the process vessel, to thereby form a thin film other than the silicon oxide film on the substrate;

supplying and exhausting, in a state that the substrate holder after repeatedly performing the thin film formation is housed in the process vessel, a fluorine-containing gas into and from the process vessel, to thereby remove deposits including the thin film attached onto the substrate holder; and reforming, in a state that the substrate holder after removal of the deposits is housed in the process vessel, a silicon oxide film on the surface of the substrate holder after removal of the deposits by repeatedly performing supplying and exhausting the silicon-containing gas into and from the process vessel, to thereby form a silicon-containing layer on the surface of the substrate holder after removal of the deposits, and supplying and exhausting the oxygen-containing gas and the hydrogen-containing gas into and from the process vessel under an atmosphere having pressure below atmospheric pressure, to thereby change the silicon-containing layer into a silicon oxide layer, wherein forming the silicon oxide film, removing the deposits, and reforming the silicon oxide film are performed without the substrate supported by the substrate holder.

2. The method of claim 1, further comprising: after forming the silicon oxide film, in a state that the substrate holder whose surface has the silicon oxide film formed thereon is housed in the process vessel, supplying and exhausting the oxygen-containing gas and the hydrogen-containing gas into and from the process vessel under an atmosphere having pressure below atmospheric pressure, to thereby modify the silicon oxide film.

3. The method of claim 1, further comprising: after forming the silicon oxide film, in a state that the substrate holder whose surface has the silicon oxide film formed thereon is housed in the process vessel, supplying and exhausting the process gas into and from the process vessel, to thereby form the thin film on the silicon oxide film.

4. The method of claim 2, further comprising: after modifying the silicon oxide film, in a state that the substrate holder whose surface has the modified silicon oxide film formed thereon is housed in the process vessel, supplying and exhausting the process gas into and from the process vessel, to thereby form the thin film on the modified silicon oxide film.

5. The method of claim 1, further comprising: after reforming the silicon oxide film, in a state that the substrate holder whose surface has the silicon oxide film reformed thereon is housed in the process vessel, supplying and exhausting the oxygen-containing gas and the hydrogen-containing gas into and from the process vessel under an atmosphere having pressure below atmospheric pressure, to thereby modify the reformed silicon oxide film.

6. The method of claim 1, further comprising: after reforming the silicon oxide film, in a state that the substrate holder whose surface has the silicon oxide film reformed thereon is housed in the process vessel, supplying and exhausting the process gas into and from the process vessel, to thereby form the thin film on the reformed silicon oxide film.

7. The method of claim 5, further comprising: after modifying the reformed silicon oxide film, in a state that the substrate holder whose surface has the modified silicon oxide film reformed thereon is housed in the process vessel, supplying and exhausting the process gas into and from the process vessel, to thereby form the thin film on the modified reformed silicon oxide film.

8. A method of manufacturing a semiconductor device, the method comprising:

forming, in a state that a process vessel houses a substrate holder formed by coating a SiC film on a surface of a carbon base material or a Si-impregnated SiC base material through a CVD process, a silicon oxide film on the surface of the substrate holder by repeatedly performing supplying and exhausting a silicon-containing gas into and from the process vessel, to thereby form a silicon-containing layer on the surface of the substrate holder; and supplying and exhausting an oxygen-containing gas and a hydrogen-containing gas into and from the process vessel under an atmosphere having pressure below atmospheric pressure, to thereby change the silicon-containing layer into a silicon oxide layer;

supplying and exhausting, in a state that the substrate holder whose surface has the silicon oxide film formed thereon is housed in the process vessel, the oxygen-containing gas and the hydrogen-containing gas into and from the process vessel under an atmosphere having pressure below atmospheric pressure, to thereby modify the silicon oxide film;

supplying and exhausting, in a state that the substrate holder whose surface has the modified silicon oxide film formed thereon is housed in the process vessel, the process gas into and from the process vessel, to thereby form a thin film other than the silicon oxide film on the modified silicon oxide film;

supplying and exhausting, in a state that the substrate is held by the substrate holder whose surface has the thin film and the modified silicon oxide film formed thereon in the process vessel, the process gas into and from the process vessel, to thereby form the thin film on the substrate;

supplying and exhausting, in a state that the substrate holder after repeatedly performing the thin film formation is housed in the process vessel, a fluorine-containing gas into and from the process vessel, to thereby remove deposits including the thin film attached onto the substrate holder;

reforming, in a state that the substrate holder after removal of the deposits is housed in the process vessel, a silicon oxide film on the surface of the substrate holder after removal of the deposits by repeatedly performing supplying and exhausting the silicon-containing gas into and from the process vessel, to thereby form a silicon-containing layer on the surface of the substrate holder after removal of the deposits; and supplying and exhausting the oxygen-containing gas and the hydrogen-containing gas into and from the process vessel under an atmosphere having pressure below atmospheric pressure, to thereby change the silicon-containing layer into a silicon oxide layer;

supplying and exhausting, in a state that the substrate holder whose surface has the silicon oxide film reformed thereon is housed in the process vessel, the oxygen-containing gas and the hydrogen-containing gas into and from the process vessel under an atmosphere having pressure below atmospheric pressure, to thereby modify the reformed silicon oxide film; and supplying and exhausting, in a state that the substrate holder whose surface has the modified silicon oxide film reformed thereon is housed in the process vessel, the process gas into and from the process vessel, to thereby form the thin film on the modified reformed silicon oxide film, wherein forming the silicon oxide film, modifying the silicon oxide film, forming the thin film on the modified silicon oxide film, removing the deposits, reforming the silicon oxide film, modifying the reformed silicon oxide film, and forming the thin film on the modified reformed silicon oxide film are performed without the substrate supported by the substrate holder.

9. The method of claim 1, wherein a thickness of the silicon oxide film is in a range between 250 Å and 2000 Å.

10. The method of claim 1, wherein reforming the silicon oxide film on the surface of the substrate holder after removal of the deposits includes:
    forming the silicon oxide film on the surface of the substrate holder; and
    removing the fluorine-containing gas remaining inside the process vessel.

11. The method of claim 10, wherein removing the fluorine-containing gas remaining inside the process vessel includes reacting includes causing a reaction between species containing an atomic oxygen, produced by reacting the oxygen-containing gas and the hydrogen-containing gas, and the remaining fluorine-containing gas.

12. The method of claim 10, wherein removing the fluorine-containing gas remaining inside the process vessel includes causing at least one of a first reaction between the hydrogen-containing gas and the remaining fluorine-containing gas, a second reaction between the oxygen-containing gas and the remaining fluorine-containing gas, and a third reaction between species containing an atomic oxygen, produced by reacting the oxygen-containing gas and the hydrogen-containing gas, and the remaining fluorine-containing gas.

13. The method of claim 1, wherein the silicon oxide film is formed to have a predetermined thickness, and reforming the silicon oxide film on the surface of the substrate holder after removal of the deposits is performed to maintain the predetermined thickness of the silicon oxide film.

14. A substrate processing apparatus, comprising:
    a process vessel configured to house a substrate therein for processing;
    a substrate holder configured to support the substrate in the process vessel, the substrate holder being formed by coating a SiC film on a surface of a carbon base material or a Si-impregnated SiC base material through a CVD process;
    a process gas supply system configured to supply a process gas into the process vessel;
    a silicon-containing gas supply system configured to supply a silicon-containing gas into the process vessel;
    an oxygen-containing gas supply system configured to supply an oxygen-containing gas into the process vessel;
    a hydrogen-containing gas supply system configured to supply a hydrogen-containing gas into the process vessel;
    a fluorine-containing gas supply system configured to supply a fluorine-containing gas into the process vessel;
    an exhaust system configured to exhaust an inside of the process vessel; and
    a controller configured to control the operations of the process gas supply system, the silicon-containing gas supply system, the oxygen-containing gas supply system, the hydrogen-containing gas supply system, the fluorine-containing gas supply system, and the exhaust system, so as to perform:

forming, in a state that the process vessel houses the substrate holder, a silicon oxide film on the surface of the substrate holder by repeatedly performing supplying and exhausting the silicon-containing gas into and from the process vessel, to thereby form a silicon-containing layer on the surface of the substrate holder, and supplying and exhausting the oxygen-containing gas and the hydrogen-containing gas into and from the process vessel under an atmosphere having pressure below atmospheric pressure, to thereby change the silicon-containing layer into a silicon oxide layer;

supplying and exhausting, in a state that the substrate is held by the substrate holder whose surface has the silicon oxide film formed thereon in the process vessel, the process gas into and from the process vessel, to thereby form a thin film other than the silicon oxide film on the substrate;

supplying and exhausting, in a state that the substrate holder after repeatedly performing the thin film formation is housed in the process vessel, a fluorine-containing gas into and from the process vessel, to thereby remove deposits including the thin film attached onto the substrate holder; and reforming, in a state that the substrate holder after removal of the deposits is housed in the process vessel, a silicon oxide film on the surface of the substrate holder after removal of the deposits by repeatedly performing supplying and exhausting the silicon-containing gas into and from the process vessel, to thereby form a silicon-containing layer on the surface of the substrate holder after removal of the deposits, and supplying and exhausting the oxygen-containing gas and the hydrogen-containing gas into and from the process vessel under an atmosphere having pressure below atmospheric pressure, to thereby change the silicon-containing layer into a silicon oxide layer, wherein forming the silicon oxide film, removing the deposits, and reforming the silicon oxide film are performed without the substrate supported by the substrate holder.

* * * * *